United States Patent [19]
Hayashi

[11] Patent Number: 5,965,905
[45] Date of Patent: Oct. 12, 1999

[54] THIN-FILM TRANSISTOR AND SRAM MEMORY CELL EQUIPPED THEREWITH

[75] Inventor: Fumihiko Hayashi, Tokyo, Japan

[73] Assignee: NEC Corporation, Tokyo, Japan

[21] Appl. No.: 08/976,723

[22] Filed: Nov. 24, 1997

[30] Foreign Application Priority Data

Nov. 22, 1996 [JP] Japan ................................. 8-312247

[51] Int. Cl.$^6$ ........................... H01L 29/04; H01L 29/76
[52] U.S. Cl. ........................... 257/60; 257/61; 257/347; 257/408; 257/903
[58] Field of Search ........................... 257/60, 61, 347, 257/408, 903

[56] References Cited

U.S. PATENT DOCUMENTS

| 5,489,792 | 2/1996 | Hu et al. ................................. | 257/347 |
| 5,821,585 | 10/1998 | Maegawa ................................. | 257/347 |

FOREIGN PATENT DOCUMENTS 7-282949   10/1995   Japan .

OTHER PUBLICATIONS

F. Hayashi et al., "The Electrical Characteristics of Lightly–Doped–Offset Polysilicon TFT", *Proceedings of 1991 Japan Applied Physics Society Spring Lecture–Meeting*, Lecture No. 30p–T–2, p. 671.

Primary Examiner—Valencia Martin-Wallace
Attorney, Agent, or Firm—Sughrue, Mion, Zinn, Macpeak & Seas, PLLC

[57] ABSTRACT

A TFT with a drain-offset structure is provided, which realizes a high ON current while keeping an OFF current at a low level. This TFT includes a substrate and a patterned semiconductor film formed on a main surface of the substrate. At least the main surface of the substrate has an insulating property. The patterned semiconductor film is made of a silicon-system semiconductor material and is not monocrystalline. The patterned semiconductor film includes a source region of a first conductivity type, a channel region of a second conductivity type opposite to the first conductivity type, a first drain region of the first conductivity type, and a second drain region of the second conductivity type. The first drain region serves as an offset region. A gate electrode is formed to be opposite to the channel region through a gate insulating film. The source region is formed on one end of the semiconductor film. The second drain region is formed on an opposite end of the semiconductor film to the source region. The channel region is formed to be adjacent to the source region and the first drain region. The first drain region is formed to be adjacent to the channel region and the second drain region.

4 Claims, 16 Drawing Sheets

THIN-FILM TRANSISTOR AND SRAM MEMORY CELL EQUIPPED THEREWITH

BACKGROUND OF THE INVENTION

1. Field of the Invention

The present invention relates to a semiconductor device and more particularly, to a Thin-Film Transistor (TFT) with the Lightly-Doped Offset (LDO) structure and a memory cell for a Static Random Access Memory (SRAM).

2. Description of the Prior Art

TFTs have been popularly used in the Liquid-Crystal Displays (LCDs) in which semiconductor circuits using the TFTs are formed on a glass substrate and the memory cell of SRAMs in which p-channel TFTs are used as load elements. The TFTs used in the LCDs are mainly formed by amorphous silicon and those used in the SRAMs are mainly formed by polycrystalline silicon (i.e., polysilicon). This material difference is due to the thermal process difference included in their fabrication sequences and the necessity of a high carrier mobility for the TFTs used in the SRAMs.

With the memory cell of the SRAMs, from the viewpoint of higher integration, it was advantageous that the load device is formed by a high resistance element. However, in recent years, the problems relating to leakage currents, noises, and α-ray-induced soft errors have been becoming obvious as the power supply voltage has been lowering with the progressing miniaturization. Thus, the configuration where a p-channel TFT is used as the load element of a memory cell of an SRAM has been becoming an important matter.

FIG. 19 shows a typical circuit configuration of a memory cell of an SRAM, in which six Metal-Oxide-Semiconductor (MOS) transistors are used.

As shown in FIG. 19, this memory cell is comprised of two n-channel access MOS transistors TA1 and TA2, two n-channel driver MOS transistors TD1 and TD2, and two p-channel load MOS transistors TL1 and TL2. The transistors TD1 and TL1 constitute a first inverter and the transistors TD2 and TL2 constitute a second inverter. The first and second inverters are cross-coupled at two nodes N1 and N2.

Source regions of the transistors TD1 and TD2 are connected to a ground line GND. Source regions of the transistors TL1 and TL2 are connected to a power supply line $V_{DD}$. One of a pair of source/drain regions of the transistor TA1 and one of a pair of source/drain regions of the transistor TA2 are connected to a pair of bit lines BL1 and BL2, respectively. Another of the pair of source/drain regions of the transistor TA1 and another of the pair of source/drain regions of the transistor TA2 are connected to the nodes N1 and N2, respectively. Gate electrodes of the transistors TL1 and TL2 are connected to a common word line WL. The signals to be applied to the pair of bit lines BL1 and BL2 are opposite in phases.

When the electric potential at the node N1 is in a high level and the that at the node N2 is in a low level, the load transistor TL1 is in the ON (i.e., conductive) state and the load transistor TL2 is in the OFF (i.e., non-conductive) state. If the potential at the node N1 is temporarily lowered due to a leakage current, a noise, or an α-ray-induced electric charge, the ON-state of the transistor TL1 is strengthened to thereby supply electric charges to the node N1, recovering the potential lowering at the node N1.

The load transistors TL1 and TL2 have by far higher capabilities for supplying the electric charges to the nodes N1 and N2 than that of the high-resistance load element. Therefore, the information or data value stored in the memory cell is difficult to be inverted. This lead to high stability of the memory cell.

The stand-by current of the SRAM is dependent upon the current flowing through the load transistor TL2 in the OFF state and the bit number.

If a p-channel TFT is used as the p-channel load transistor TL1 or TL2, this TFT needs to have both of a high current-driving capability (i.e., high ON current) and a low stand-by current (i.e., low OFF current). The high ON-current makes it possible to quickly raise the low node potential immediately after the data writing operation up to the power supply voltage, which is advantageous for high-speed operation.

To satisfy this requirement, the inventor and others reported an improved p-channel TFT having the Lightly-Doped Offset (LDO) structure, which was disclosed in Proceedings of 1991 Japan Applied Physics Society Spring Lecture-Meeting, p. 671, Lecture No. 30p-T-2, published in 1991. This p-channel TFT with the LDO structure is fabricated in the following way.

First, as shown in FIG. 1A, an insulating film 402 with a thickness of 100 to 800 nm is formed on a semiconductor substrate 401 by thermal oxidation or Chemical Vapor Deposition (CVD). The insulating film 402 is made of an oxide. After a gate electrode 404 with a thickness of 50 to 100 nm is formed on the insulating film 402, a gate insulating film 406, which is made of silicon dioxide and has a thickness of 5 to 20 nm, is formed on the insulating film 402 over the entire substrate 401 by Low-Pressure CVD (LPCVD). The gate electrode 404 is covered with the gate insulating film 406.

Further, an undoped polysilicon film (not shown) is formed on the gate insulating film 406 over the whole substrate by LPCVD. An n-type impurity such as phosphorus (P) is doped into this polysilicon film by ion-implantation until this polysilicon film has a doping concentration of $1\times10^{15}$ to $1\times10^{18}$ atoms/cm$^3$. The impurity-doped polysilicon film is patterned to thereby form a patterned n$^-$-type polysilicon film 411. The state at this stage is shown in FIG. 1A.

Subsequently, as shown in FIG. 1B, using a patterned photoresist film 426a as a mask, boron (as a p-type dopant) is selectively doped into the n$^-$-type polysilicon film 411 by ion-implantation so that the implanted part of the n$^-$-type polysilicon film 411 has a doping concentration of $1\times10^{18}$ to $1\times10^{19}$ atoms/cm$^3$. Thus, a p$^-$-type polysilicon region 415 is formed in the n$^-$-type polysilicon film 411. The remaining part of the n$^-$-type polysilicon film 411 serves as an n$^-$-type polysilicon region 411a. The state at this stage is shown in FIG. 1B.

After the photoresist film 426a is then removed, as shown in FIG. 1C, using a patterned photoresist film 426b as a mask, boron (as a p-type dopant) is selectively doped into the p$^-$-type polysilicon region 415 and the n$^-$-type polysilicon region 411a. Thus, a p$^+$-type polysilicon region 416a is formed in the p$^-$-type polysilicon region 415 and another p$^+$-type polysilicon region 416b is formed in the n$^-$-type polysilicon region 411a. The p$^+$-type polysilicon regions 416a and 416b have doping concentrations of $1\times10^{19}$ to $1\times10^{21}$ atoms/cm$^3$. The remaining part of the n$^-$-type polysilicon region 411a serves as an n$^-$-type polysilicon region 411aa. The state at this stage is shown in FIG. 1C.

Then, the photoresist film 426b is removed. Thus, the above-described p-channel TFT with the LDO structure is completed, as shown in FIG. 1D.

Following this, although not shown, an interlayer insulating film and a metallic wiring film are successively formed on the TFT by know processes.

This p-channel TFT with the LDO structure is of the bottom gate type. The p$^+$-type polysilicon region 416b, the n$^-$-type polysilicon region 411a, and the p$^+$-type polysilicon region 416a serve as a source region, a channel region, and a drain region, respectively. The p$^+$-type polysilicon region 416a serving as the drain region is laterally shifted toward the right-hand side in FIG. 1D with respect to the gate electrode 404 by 0.1 to 0.6 μm. In other words, the drain region 416a has an offset of 0.1 to 0.6 μm with respect to the gate electrode 404. The p$^-$-type polysilicon region 415a, which is located between the n$^-$-type channel region 411aa and the p$^+$-type drain region 416a, constitute an offset region.

The p$^-$-type polysilicon offset region 415a has an effect of decreasing the gradient of the dopant concentration between the n$^-$-type channel region 411aa and the p$^+$-type drain region 416a. Not only the positional shift of the drain region 416a but also this gradient-decreasing effect will relax the electric field near the drain region 416a. Therefore, the OFF current of the p-channel TFT with the LDO structure is readily decreased to a low level compared with the simple offset structure where the offset region is formed by a same semiconductor as that of the channel region.

Further, since the p$^+$-type drain region 416a serves as the drain region, the parasitic resistance in the drain region is decreased. Thus, the ON current of the TFT with the LDO structure is readily increased compared with the simple offset structure.

The LDO structure may be applied to TFTs of the top gate type. Also, if the gate insulating film needs to have a sufficiently large thickness, a patterned p$^-$-type polysilicon film having a lower doping concentration than the p$^-$-type polysilicon film 415a may be used instead of the patterned n$^-$-type polysilicon film 411.

Moreover, the LDO structure may be applied to the TFTs designed for LCDs where an amorphous polysilicon is mainly used for fabricating the TFTs. The LDO structure may be applied to n-channel TFTs.

As described above, with the conventional p-channel TFT with the LDO structure shown in FIG. 1D, the p$^-$-type polysilicon region 415a located between the n$^-$-type polysilicon channel region 411aa and the p$^+$-type polysilicon drain region 416a serves as the offset region. Due to the existence of the p$^-$-type polysilicon offset region 415a, the ON current of the TFT with the LDO structure is greater in absolute value than that with the simple offset structure, and the OFF current of the TFT with the LDO structure is less in absolute value than that with the simple offset structure.

However, the conventional TFT with the LDO structure has the following problem.

The p$^-$-type polysilicon offset region 415a needs to have a specific "offset length" allowing the Off current to decrease to a desired level, where the offset length is defined as the length from the drain-side edge of the n$^-$-type channel region 411aa to the channel-side edge of the p$^+$-type drain region 416a. The p$^-$-type polysilicon offset region 415a serves as a resistor serially-connected to the n$^-$-type channel region 411aa and the p$^+$-type drain region 416a, which decreases the ON current. The resistance of this resistor varies as a function of the doping concentration of the p$^-$-type polysilicon offset region 415a and the offset length. Therefore, if the doping concentration of the p$^-$-type polysilicon offset region 415a is increased, the resistance of the resistor may be decreased. In this case, however, there arises a disadvantage that the OFF current is increased due to the electric-field increase near the channel-side edge of the drain region 416a.

Thus, with the conventional p-channel TFT with the LDO structure, the ON and OFF currents constitute an antinomy.

A similar antinomy exists in a memory cell of an SRAM using the conventional p-channel TFT with the LDO structure.

Specifically, if the length of the p$^-$-type polysilicon offset region 415a (i.e., the offset length) is shortened and the doping concentration of the offset region 415a is raised, the ON current of the TFT will be increased. This enables the high-speed operation of the SRAM and stabilizes the operation of the TFT at a low power supply voltage. However, in this case, the stand-by current of the TFT is raised due to the increased ON current and as a result, it is difficult to reduce the electric power dissipation of the SRAM.

Also, the offset-length tends to fluctuate for the two p-channel TFTs in the memory cell during the photolithography process in the fabrication process sequence. Therefore, the operation of the memory cell tends to be unstable at a low power-supply voltage due to this offset-length fluctuation.

SUMMARY OF THE INVENTION

Accordingly, an object of the present invention is to provide a TFT with a drain-offset structure that realizes a high ON current while keeping an OFF current at a low level.

Another object of the present invention is to provide a TFT with a drain-offset structure in which the TFT operation is difficult to be affected by offset-length fluctuation.

Still another object of the present invention is to provide a memory cell of an SRAM that realizes simultaneously high-speed operation, high operation stability at a low power-supply voltage, and low electric-power dissipation.

The above objects together with others not specifically mentioned will become clear to those skilled in the art from the following description.

According to a first aspect of the present invention, a TFT is provided. This TFT is comprised of a substrate and a patterned semiconductor film formed on a main surface of the substrate. At least the main surface of the substrate has an insulating property. The patterned semiconductor film is made of a silicon-system semiconductor material and is not monocrystalline.

The patterned semiconductor film includes a source region of a first conductivity type, a channel region of a second conductivity type opposite to the first conductivity type, a first drain region of the first conductivity type, and a second drain region of the second conductivity type. The first drain region serves as an offset region.

A gate electrode is formed to be opposite to the channel region through a gate insulating film.

The source region is formed on one end of the semiconductor film. The second drain region is formed on an opposite end of the semiconductor film to the source region. The channel region is formed to be adjacent to the source region and the first drain region. The first drain region is formed to be adjacent to the channel region and the second drain region.

A first voltage is applied across the source region and the second drain region. A second voltage is applied to the gate electrode.

With the TFT according to the first aspect of the present invention, the source region is formed on one end of the semiconductor film, and the second drain region is formed on an opposite end of the semiconductor film to the source region. The channel region is formed to be adjacent to the source region and the first drain region. The first drain region, which serves as the offset region, is formed to be adjacent to the channel region and the second drain region.

Also, the first voltage is applied across the source region and the second drain region, and the second voltage is applied to the gate electrode.

Therefore, when the second voltage is greater than a specific value, the majority carriers in the second drain region are diffused into the channel region through the first drain region and then, they are accumulated at the source-side edge of the channel region due to the applied first voltage, which is termed the "parasitic bipolar effect". The accumulated majority carriers in the channel region has a function of decreasing the threshold voltage. The density of the accumulated majority carriers increases with the increasing applied second voltage.

Accordingly, the threshold voltage will decrease with the increasing applied second voltage and as a result, the ON current becomes higher compared with the case where the parasitic bipolar effect is not utilized. This means that a high ON current can be realized while keeping an OFF current at a low level.

Further, since the ON current is raised due to the parasitic bipolar effect, it is difficult to be affected by the change in the offset length. Consequently, the TFT operation is difficult to be affected by offset-length fluctuation.

The TFT according to the first aspect of the present invention may be of the top gate type or the bottom gate type.

In a preferred embodiment of the TFT according to the first aspect, the channel region has a doping concentration less than that of the first drain region.

According to a second aspect of the present invention, a memory cell of an SRAM is provided.

This memory cell is comprised of first and second n-channel driver MOS transistors, first and second n-channel access MOS transistors, first and second p-channel load MOS transistors.

Source regions of the first driver transistor and the second driver transistor are connected to a first voltage line. Source regions of the first and second load transistors are connected to a second voltage line. One of a pair of source/drain regions of the first access transistor and one of a pair of source/drain regions of the second access transistor are connected to a pair of bit lines, respectively. Another of the pair of source/drain regions of the first access transistor and another of the pair of source/drain regions of the second access transistor are connected to first and second nodes, respectively. Gate electrodes of the first and second load transistors are connected to a common word line.

The first driver transistor and the first load transistor constitute a first inverter. The second driver transistor and the second load transistor constitute a second inverter. The first and second inverters are cross-coupled at the first and second nodes.

Each of the first and second load transistors is formed by the TFT according to the first aspect of the present invention.

With the memory cell of an SRAM according to the second aspect of the present invention, because each of the first and second load transistors is formed by the TFT according to the first aspect of the present invention, the ON current becomes high while the OFF current is kept sufficiently low.

Accordingly, this memory cell is capable of high-speed operation because of the high ON current and at the same time, it is capable of high operation stability at a low-power-supply voltage because of the high ON current and the insusceptibility to the offset-length fluctuation.

Also, this memory cell is capable of low electric-power dissipation due to the low OFF current.

In a preferred embodiment of the memory cell according to the second aspect, each of the first and second load transistors has the channel region with a doping concentration less than that of the first drain region.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to FIGS. 2 to 20.

First Embodiment

Figure 2:
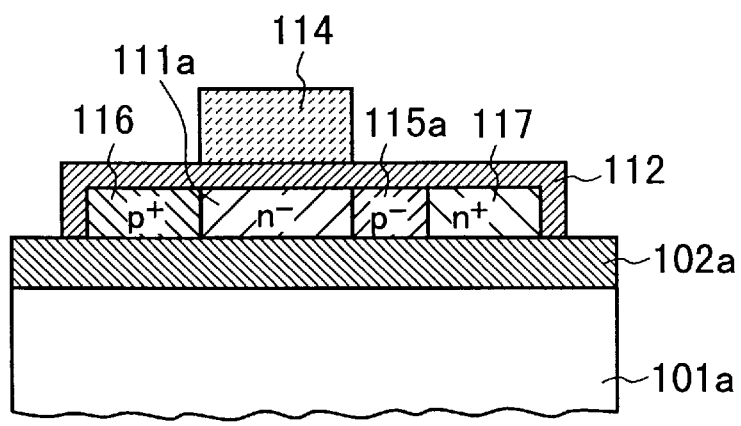
FIG. 2 is a cross-sectional view of a p-channel TFT according to a first embodiment of the present invention, which is the bottom-gate type.

A top-gate type p-channel TFT according to a first embodiment of the present invention has a configuration as shown in FIG. 2. This TFT is mainly formed by using a patterned n⁻-type polysilicon film.

In FIG. 2, an insulating film 102a with a thickness of 100 to 800 nm is formed on a semiconductor substrate 101a. A p⁺-type polysilicon region 116, an n⁻-type polysilicon region 111a, a p⁻-type polysilicon region 115a, and an n⁺-type polysilicon region 117 are formed to be arranged to be adjacent one another within an n⁻-type patterned polysilicon film formed on the insulating film 102a.

The p⁺-type polysilicon region 116 and the n-type polysilicon region 117 are located at each end of the n⁻-type patterned polysilicon film. The n⁻-type polysilicon region 111a is formed to be adjacent to the p⁺-type polysilicon region 116 and the p⁻-type polysilicon region 115a. The p⁻-type polysilicon region 115a is formed to be adjacent to the n⁻-type polysilicon region 111a and the n⁺-type polysilicon region 117.

The n⁻-type polysilicon region 111a has a doping concentration of $1 \times 10^{16}$ to $1 \times 10^{18}$ atoms/cm³. The p⁻-type polysilicon region 115a has a doping concentration of $1 \times 10^{18}$ to $1 \times 10^{19}$ atoms/cm³. The p⁺-type polysilicon region 116 has a doping concentration of $1 \times 10^{19}$ to $1 \times 10^{21}$ atoms/cm³. The n⁺-type polysilicon region 117 has a doping concentration of $1 \times 10^{18}$ to $1 \times 10^{21}$ atoms/cm³.

From the viewpoint of the doping concentration of $1 \times 10^{18}$ to $1 \times 10^{21}$ atoms/cm³, the region 117 should be referred as "n- or n⁺-type polysilicon region". However, this region 117 is referred as "n⁺-type polysilicon region" here.

The top and side surfaces of the n⁻-type patterned polysilicon film are covered with a gate oxide film 112 with a thickness of 5 to 20 nm. A gate electrode 114, which is formed by a patterned n⁺-type polysilicon film with a thickness of 50 to 200 nm, is located just over the n⁻-type polysilicon region 111a in self alignment with the region 111a.

The p⁺-type polysilicon region 116 serves as a source region. The n⁻-type polysilicon region 111a serves as a channel region. The p⁻-type polysilicon region 115a serves as a first drain region, which is an offset region with an offset length of approximately 0.3 to 0.6 μm. The n⁺-type polysilicon region 117 serves as a second drain region.

Although not shown in FIG. 2, an interlayer insulating layer and metallic wiring layer are formed to cover the p-channel TFT.

With the p-channel TFT according to the first embodiment, when the p⁺-type polysilicon region 116 serving as the source region is directly connected to the ground line GND, a negative gate voltage $V_G$ is directly applied to the gate electrode 114 and at the same time, a negative drain voltage $V_D$ is applied to the n⁺-type polysilicon region 117 serving as the second drain region. The drain voltage $V_D$ is not directly applied to the p⁻-type polysilicon region 115a serving as the first drain region. Thus, the n⁺-type second drain region 117 and the p⁻-type first drain region 115a are forward-biased.

Next, the operation principle of the p-channel TFT according to the first embodiment will be explained below with reference to FIG. 3.

Figure 3:
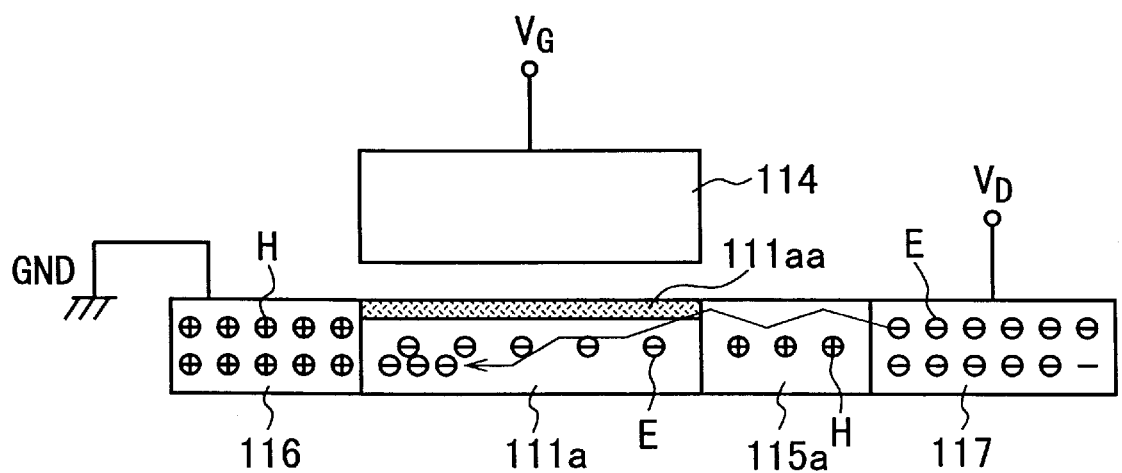
FIG. 3 is a schematic diagram showing the operation principle of the TFT according to the first embodiment in FIG. 2.

As shown in FIG. 3, the p⁺-type polysilicon source region 115 is connected to the ground, the n⁺-type polysilicon second drain region 117 is connected to a power supply line to be applied with a drain voltage $V_D$ of −2.5 V, and the gate electrode 114 is applied with a negative gate voltage $V_G$. When the gate voltage $V_G$ is approximately equal to 0, this TFT is in the OFF sate due to a potential barrier formed at the interface of the n⁻-type polysilicon channel region 111a and the p⁺-type polysilicon source region 115.

When the gate voltage $V_G$ is increased to a negative specific value, an inversion layer 111aa is formed in the channel region 111a, as shown in FIG. 3. At this stage, holes H existing in the source region 116 flow into the first and second drain regions 115a and 117 through the channel region 111a. Then, the holes H thus flown are recombined with electrons E existing in the first and second drain regions 115a and 117, resulting in an electric current flowing from the second drain region 117 toward the source region 116 in total.

Thus, part of the electrons E in the second drain region 117 flow into the channel region 111a through the first drain region 115a and then, they are accumulated at the source-side edge of the channel region 111a. The accumulated electrons E in the channel region 111a has a function of decreasing the threshold voltage $V_{TP}$ of this TFT. The density of the accumulated electrons E increases with the increasing applied drain voltage $V_D$.

Accordingly, the threshold voltage $V_{TP}$ will decrease with the increasing applied drain voltage $V_D$ and as a result, the ON current becomes higher. This means that a high ON current can be realized while keeping the OFF current at a low level.

Usually, the above phenomenon occurred in an MOS transistor with the Silicon-On-Insulator (SOI) structure is termed the "parasitic bipolar effect". The MOS transistor is designed to prevent this phenomenon from occurring because this phenomenon degrades the stability of the characteristics of the MOS transistor.

However, the lifetime of the carriers is sufficiently short and the accumulated electrons E will disappear quickly in TFTs formed by using a non-monocrystalline silicon-system semiconductor material such as polysilicon. Therefore, substantially no problem occurs due to the parasitic bipolar effect in the TFTs having the conventional simple offset structure and the conventional LDO structure.

With the p-channel TFT according to the first embodiment in FIG. 2, as explained above, the parasitic bipolar effect is positively utilized by providing the first and second drain regions 115a and 117.

The p-channel TFT according to the first embodiment in FIG. 2 has a conductivity pattern of p⁺-n⁻-p⁻-n⁺. This is similar to that of a thyristor, especially, an n-type gate Silicon-Controlled Rectifier (SCR) which is one of the reverse-blocking triode thyristors.

The p-channel TFT according to the first embodiment operates in a region equivalent to the forward blocking region of the thyristor, in which the drain voltage $V_D$ is approximately equal to −2.5 V lower than the typical breakover voltage $V_{BO}$ of the thyristor. The drain voltage $V_D$ of this TFT corresponding to the breakover voltage $V_{BO}$ is approximately equal to −5 V.

The chief difference between the p-channel TFT according to the first embodiment and the n-type gate SCR exists in the following two points.

First, this TFT is formed by using a patterned polycrystalline silicon film while the n-type gate SCR is formed in a monocrystalline silicon substrate.

Second, this TFT utilizes the insulated-gate type field effect while the n-type gate SCR utilizes the junction-type field effect. Because of the use of the insulated-gate type field effect, the ON current of this TFT is greater in absolute value than the current of the n-type gate SCR within the forward blocking region.

Figure 4:
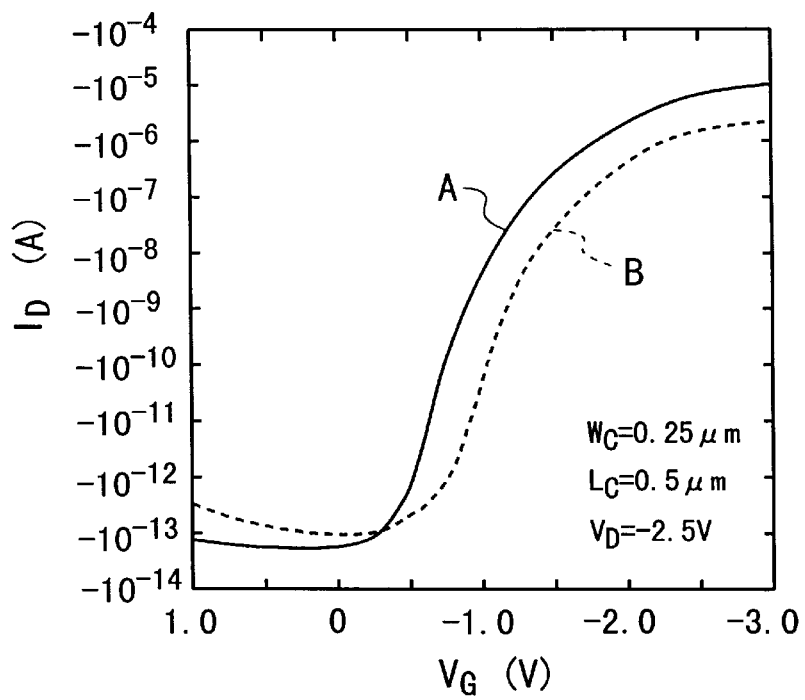
FIG. 4 is a graph showing the relationship between the drain current and the gate voltage of the TFT according to the first embodiment in FIG. 2, in which the same relationship of the conventional TFT is shown for comparison.
Figure 5:
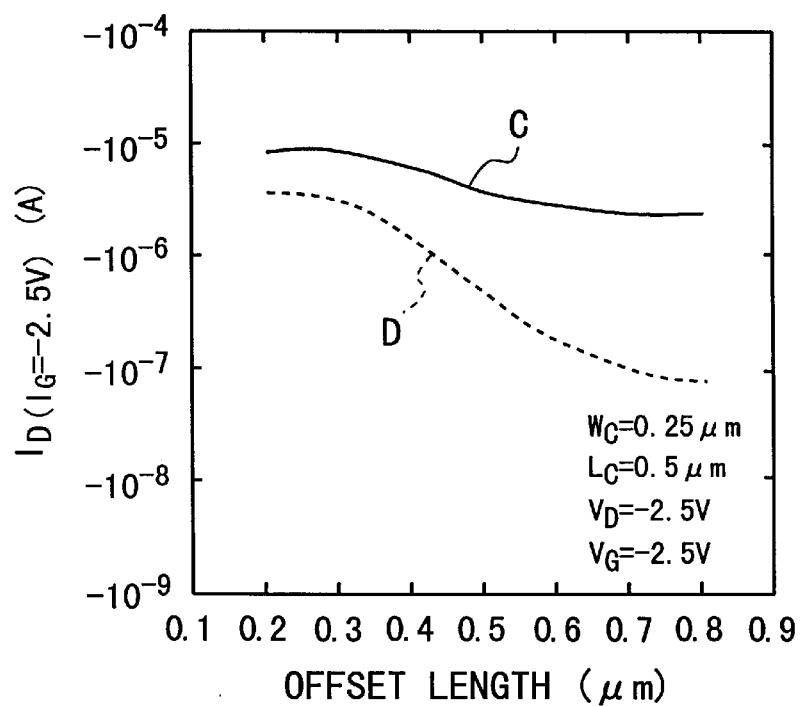
FIG. 5 is a graph showing the relationship between the ON current and the offset length of the TFT according to the first embodiment in FIG. 2, in which the same relationship of the conventional TFT is shown for comparison.

FIGS. 4 and 5 show the advantages of the TFT according to the first embodiment, in which FIG. 4 shows the $I_D$-$V_G$ characteristic and FIG. 5 shows the offset-length dependence of the ON current $I_D$.

When the patterned n⁻-type polysilicon film, in which the regions 116, 111a, 115a, and 117 are formed, has a thickness of 100 nm, the n⁻-type polysilicon channel region 111a has a doping concentration of $1 \times 10^{17}$ atoms/cm³, the p⁻-type polysilicon first drain region 115a has a doping concentration of $1 \times 10^{18}$ atoms/cm³, the p⁺-type polysilicon source region 116 has a doping concentration of $3 \times 10^{19}$ atoms/cm³, the n⁺-type polysilicon second drain, region 117 has a doping concentration of $1 \times 10^{19}$ atoms/cm³, the gate oxide film 112 has a thickness of 10 nm, the channel length $L_C$ is 0.5 μm, the offset length is 0.4 μm the channel width $W_C$ is 0.25 μm, and the drain voltage $V_D$ is −2.5 V, the gate-voltage ($V_G$) dependence of the drain current ($I_D$) is expressed by the curve A in FIG. 4.

Figure 1A:
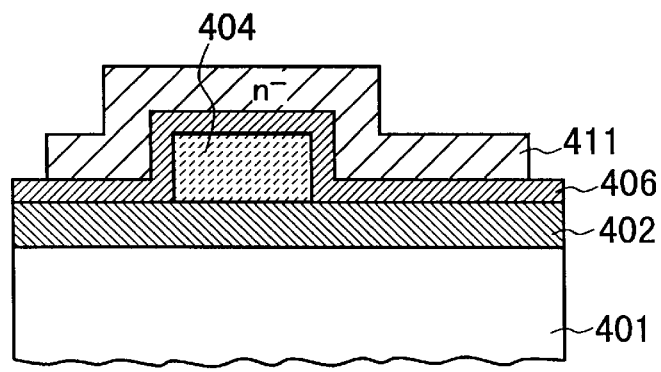
FIGS. 1A to 1D are cross-sectional views of a conventional TFT, which shows a fabrication method of the TFT, respectively.
Figure 1B:
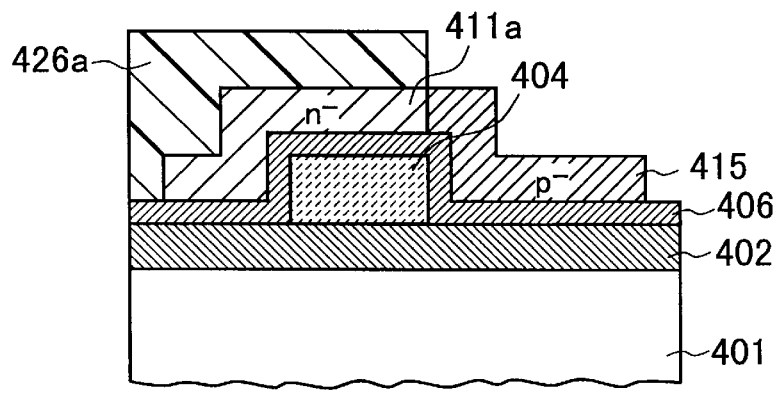
Figure 1C:
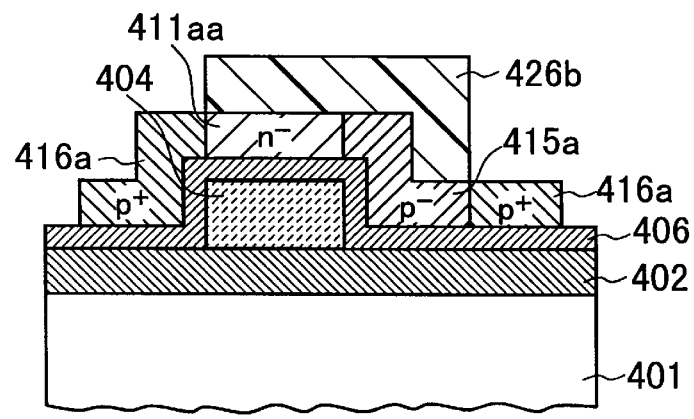
Figure 1D:
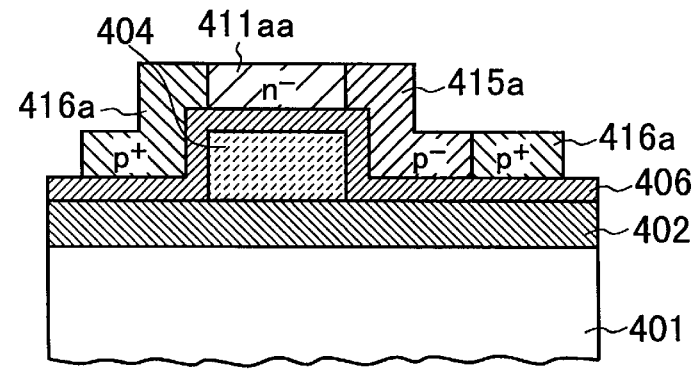

The gate-voltage ($V_G$) dependence of the drain current ($I_D$) of the conventional TFT with the LDO structure shown in FIG. 1D is expressed by the curve 3 in FIG. 4, which was obtained under the same condition as above.

As seen from FIG. 4, the TFT according to the first embodiment has a higher ON current and a lower OFF current than those of the conventional TFT in FIG. 1D.

As seen from FIG. 5, the TFT according to the first embodiment has a higher stability against the offset-length fluctuation than that of the conventional TFT in FIG. 1D.

Next, a fabrication method of the p-channel TFT according to the first embodiment is explained below with reference to FIGS. 6A to 6D.

Figure 6A:
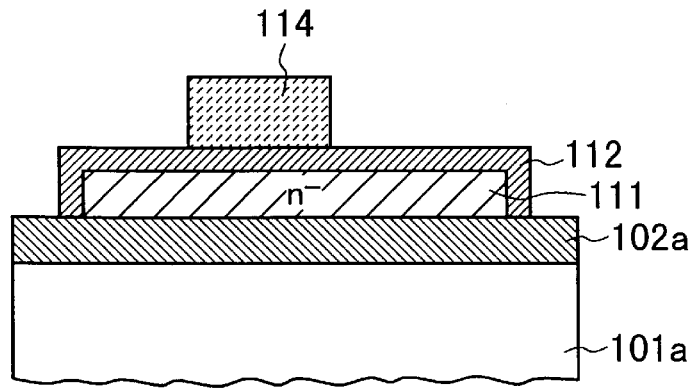
FIGS. 6A to 6D are cross-sectional views of the TFT according to the first embodiment in FIG. 2, which shows a fabrication method of the TFT, respectively.

First, as shown in FIG. 6A, the insulating film 102a with a thickness of 100 to 800 nm is formed on the main surface of the semiconductor substrate 101a by CVD. The insulating film 102a is made of an oxide. Then, an amorphous silicon film (not shown) with a thickness of 10 to 100 nm is formed on the insulating film 102a by LPCVD at a temperature of 400 to 500° C. The amorphous silicon film is subjected to a heat treatment in a nitrogen ($N_2$) atmosphere at a temperature of approximately 600° C. for 3 to 30 hours, thereby crystallizing the amorphous silicon film. Thus, a polysilicon film (not shown) is formed from the amorphous silicon film. Phosphorus (P) as an n-type impurity is doped into the polysilicon film thus formed by ion-implantation, resulting in an n⁻-type polysilicon film (not shown) having a doping concentration of $1 \times 10^{16}$ to $1 \times 10^{18}$ atoms/cm³. This n⁻-type polysilicon film is then subjected to a patterning process to thereby form the patterned n⁻-type polysilicon film 111 on the insulating film 102a, as shown in FIG. 6A.

Next, the gate oxide film 112 with a thickness of 5 to 20 nm is formed on the patterned polysilicon film 111 by thermal oxidation. The gate electrode 114 is then formed on the gate oxide film 112 by patterning an n⁺-type polysilicon film with a thickness of 50 to 200 nm. The state at this stage is shown in FIG. 6A.

Figure 6B:
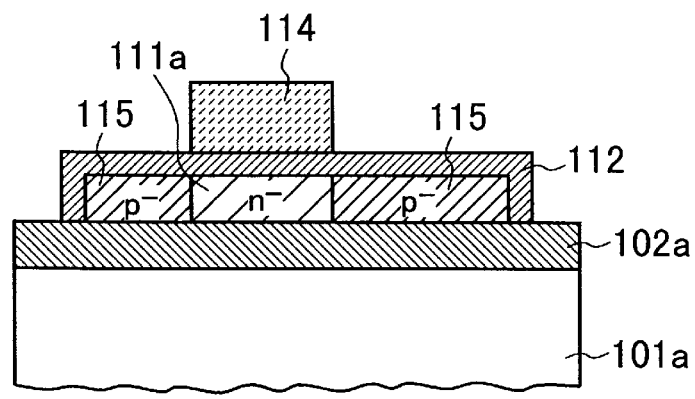

Subsequently, using the gate electrode 114 as a mask, boron (B) as a p-type impurity is selectively doped into the patterned polysilicon film 111 by ion-implantation, thereby forming p⁻-type polysilicon regions 115 with a doping concentration of $1 \times 10^{18}$ to $1 \times 10^{19}$ atoms/cm³, as shown in FIG. 6B. The part 111a of the patterned polysilicon film 111 remains undoped. The part 111a of the patterned polysilicon film 111 serves as the channel region. The state at this stage is shown in FIG. 6B.

Figure 6C:
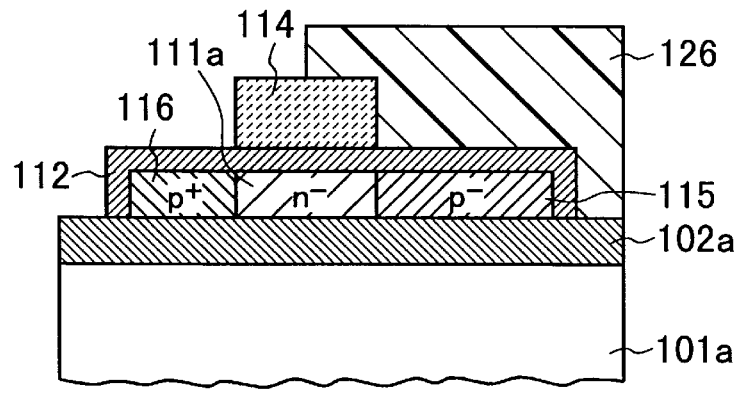

Further, using a patterned photoresist film 126 and the gate electrode 114 as a mask, boron (B) as a p-type dopant is selectively doped into the p⁻-type polysilicon region 115 located on the left-hand side by ion-implantation, resulting in the p⁺-type polysilicon region 116 serving as the source region, as shown in FIG. 6C.

Figure 6D:
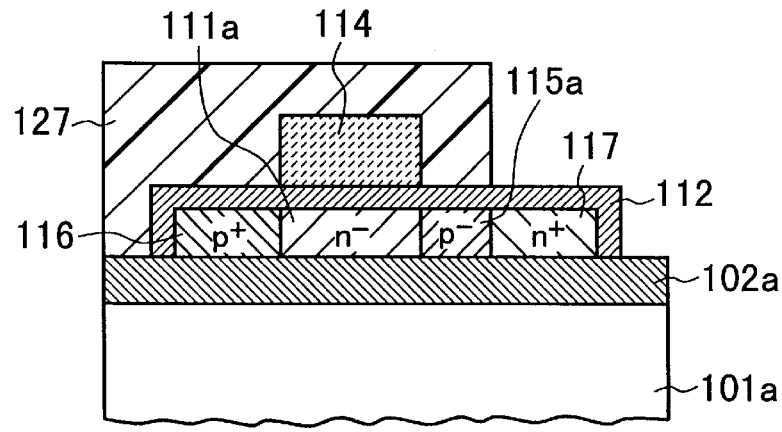

After the photoresist film 126 is removed, as shown in FIG. 6D, using a patterned photoresist film 127 as a mask, phosphorus (P) or arsenic (As) as an n-type dopant is selectively doped into the p⁻-type polysilicon region 115 located on the right-hand side. The edge of the mask 127 on the right-hand side is placed over the region 115. Therefore, the n⁺-type polysilicon region 117 is formed in the p⁻-type polysilicon region 115 and at the same time, the part 115a of the p⁻-type polysilicon region 115 remains undoped.

The n⁺-type polysilicon region 117 serves as the second drain region. The p⁻-type polysilicon region 115a serves as the first drain region and the offset region.

Thus, the p-channel TFT according to the first embodiment as shown in FIG. 2 is completed.

In the p-channel TFT according to the first embodiment as shown in FIG. 2, the patterned n⁻-type polysilicon film is used as the basic material and the gate electrode 114 is formed by the patterned n⁺-type polysilicon film. However, this TFT is not limited to these materials.

A patterned p⁻-type polysilicon film having a doping concentration of $1 \times 10^{16}$ to $1 \times 10^{18}$ atoms/cm³, which is lower than that of the p⁻-type polysilicon region 115a serving as the offset and second drain regions, may be used as the basic material.

A patterned p⁻- or n⁻-type polycrystalline film made of a mixed crystal of silicon (Si) and germanium (Ge) may be used as the basic material. There is an additional advantage that the carrier mobility is higher than that of the polysilicon film.

The gate electrode 114 may be made any material such as polycide, p⁺-type polysilicon, silicide, and refractory metal.

Any other substrate such as a glass substrate may be used as the substrate 101a. In the case of the glass substrate, a patterned n⁻-type amorphous silicon film having a doping concentration of $1 \times 10^{16}$ to $1 \times 10^{18}$ atoms/cm³ or a patterned p⁻- or n⁻-type polycrystalline film made of a mixed crystal of silicon (Si) and germanium (Ge) may be used as the basic material.

Figure 20:
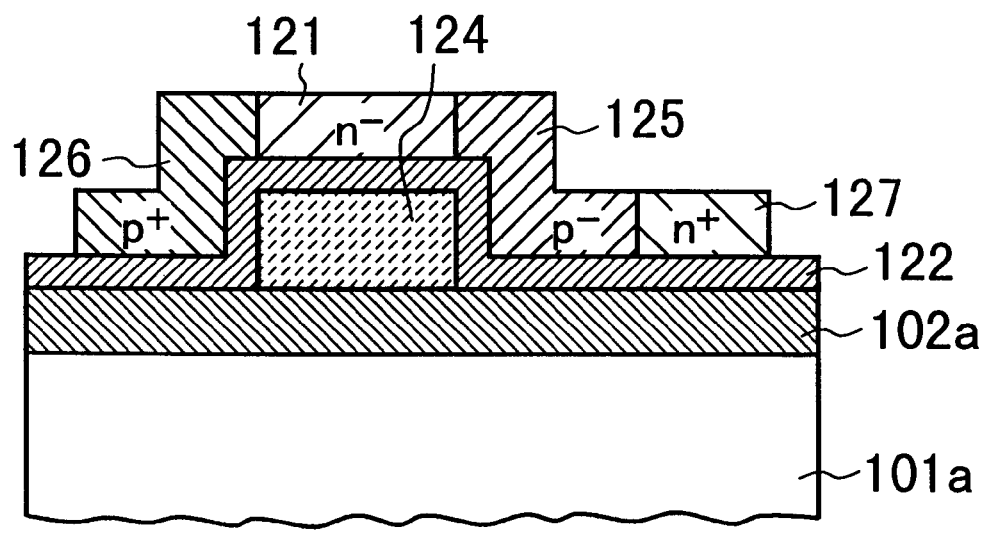
FIG. 20 is a cross-sectional view of a p-channel TFT according to a variation of the first embodiment of the present invention, which is the top-gate type.

This TFT may be of the bottom-gate type, as shown in FIG. 20.

In FIG. 20, an insulating film 102a with a thickness of 100 to 800 nm is formed on a semiconductor substrate 101a. A gate electrode 124, which is formed by a patterned n$^+$-type polysilicon film with a thickness of 50 to 200 nm, is located on the insulating film 102a. A gate oxide film 122 is formed on the insulating film 122 to cover the gate electrode 124.

An n$^-$-type patterned polysilicon film is formed on the gate oxide film 122. A p$^+$-type polysilicon region 126, an n$^-$-type polysilicon region 121, a p$^-$-type polysilicon region 125, and an n$^+$-type polysilicon region 127 are formed to be arranged to be adjacent one another within the n$^-$-type patterned polysilicon film.

The p$^+$-type polysilicon region 126 and the n$^+$-type polysilicon region 127 are located at each end of the n$^-$-type patterned polysilicon film. The n$^-$-type polysilicon region 121 is formed to be adjacent to the p$^+$-type polysilicon region 126 and the p$^-$-type polysilicon region 125. The p$^-$-type polysilicon region 125 is formed to be adjacent to the n$^-$-type polysilicon region 121 and the n$^+$-type polysilicon region 127.

The p$^+$-type polysilicon region 126 serves as a source region. The n$^-$-type polysilicon region 121 serves as a channel region. The p$^-$-type polysilicon region 125 serves as a first drain region, which is an offset region with an offset length of approximately 0.3 to 0.6 $\mu$m. The n$^+$-type polysilicon region 127 serves as a second drain region.

There are the same advantages as those in the first embodiment in which the TFT is of the top-gate type.

Second Embodiment

Figure 7:
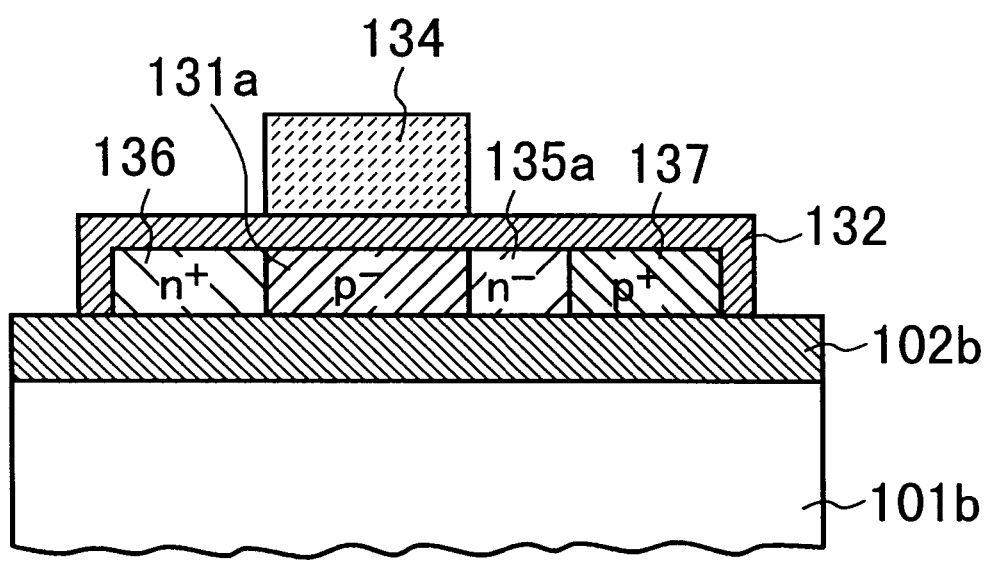
FIG. 7 is a cross-sectional view of a p-channel TFT according to a second embodiment of the present invention, which is the bottom-gate type.

A top-gate type n-channel TFT according to a second embodiment of the present invention has a configuration as shown in FIG. 7, which is equivalent to one obtained by inverting the conductivity type of the TFT according to the first embodiment. This TFT is mainly formed by using a patterned p$^-$-type polysilicon film.

In FIG. 7, an insulating film 102b with a thickness of 100 to 800 nm is formed on a semiconductor substrate 101b. An n$^+$-type polysilicon region 136, a p$^-$-type polysilicon region 131a, an n$^-$-type polysilicon region 135a, and a p$^+$-type polysilicon region 137 are formed to be arranged to be adjacent one another within a p$^-$-type patterned polysilicon film formed on the insulating film 102b.

The n$^+$-type polysilicon region 136 and the p-type polysilicon region 137 are located at each end of the p$^-$-type patterned polysilicon film. The p$^-$-type polysilicon region 131a is formed to be adjacent to the n$^+$-type polysilicon region 136 and the n$^-$-type polysilicon region 135a. The n$^-$-type polysilicon region 135a is formed to be adjacent to the p$^-$-type polysilicon region 131a and the p$^+$-type polysilicon region 137.

The p$^-$-type polysilicon region 131a has a doping concentration of $1\times10^{16}$ to $1\times10^{18}$ atoms/cm$^3$. The n$^-$-type polysilicon region 135a has a doping concentration of $1\times10^{18}$ to $1\times10^{19}$ atoms/cm$^3$. The n$^+$-type polysilicon region 136 has a doping concentration of $1\times10^{19}$ to $1\times10^{21}$ atoms/cm$^3$. The p$^+$-type polysilicon region 137 has a doping concentration of $1\times10^{18}$ to $1\times10^{21}$ atoms/cm$^3$.

From the viewpoint of the doping concentration of $1\times10^{18}$ to $1\times10^{21}$ atoms/cm$^3$, the region 137 should be referred as "p- or p$^+$-type polysilicon region". However, this region 137 is referred as "p$^+$-type polysilicon region" here.

The top and side surfaces of the p$^-$-type patterned polysilicon film are covered with a gate oxide film 132 with a thickness of 5 to 20 nm. A gate electrode 134, which is formed by a patterned n$^+$-type polysilicon film with a thickness of 50 to 200 nm, is located just over the p$^-$-type polysilicon region 131a in self alignment with the region 131a.

The n$^+$-type polysilicon region 136 serves as a source region. The p$^-$-type polysilicon region 131a serves as a channel region. The n$^-$-type polysilicon region 135a serves as a first drain region, which is an offset region with an offset length of approximately 0.3 to 0.6 $\mu$m. The p$^+$-type polysilicon region 137 serves as a second drain region.

Although not shown in FIG. 7, an interlayer insulating layer and metallic wiring layer are formed to cover the n-channel TFT.

With the n-channel TFT according to the second embodiment, when the n$^+$-type polysilicon region 136 serving as the source region is directly connected to the ground line GND, a positive gate voltage $V_G$ is directly applied to the gate electrode 134 and at the same time, a positive drain voltage $V_D$ is applied to the p$^+$-type polysilicon region 137 serving as the second drain region. The drain voltage $V_D$ is not directly applied to the n$^-$-type polysilicon region 135a serving as the first drain region. Thus, the p$^+$-type second drain region 137 and the n$^-$-type first drain region 135a are forward-biased.

The operation principle of the n-channel TFT according to the second embodiment is substantially the same as that of the first embodiment.

Next, a fabrication method of the n-channel TFT according to the second embodiment is explained below with reference to FIGS. 8A to 8D.

Figure 8A:
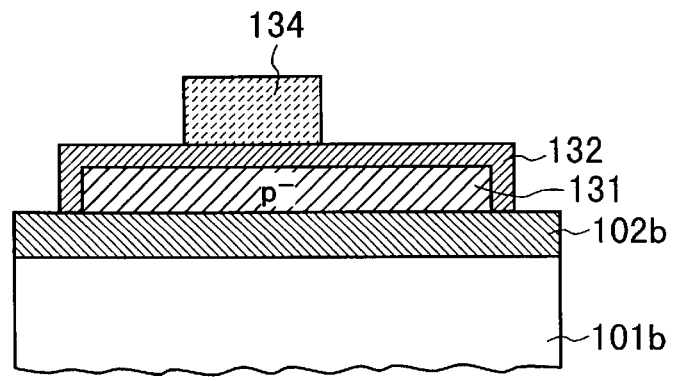
FIGS. 8A to 8D are cross-sectional views of the TFT according to the second embodiment in FIG. 7, which shows a fabrication method of the TFT, respectively.

First, as shown in FIG. 8A, the insulating film 102b with a thickness of 100 to 800 nm is formed on the main surface of the semiconductor substrate 101b by CVD. The insulating film 102b is made of an oxide. Then, an amorphous silicon film (not shown) with a thickness of 10 to 100 nm is formed on the insulating film 102b by LPCVD at a temperature of 400 to 500° C. The amorphous silicon film is subjected to a heat treatment in a nitrogen (N$_2$) atmosphere at a temperature of approximately 600° C. for 3 to 30 hours, thereby crystallizing the amorphous silicon film. Thus, a polysilicon film (not shown) is formed from the amorphous silicon film. Boron (B) as a p-type impurity is doped into the polysilicon film thus formed by ion-implantation, resulting in a p$^-$-type polysilicon film (not shown) having a doping concentration of $1\times10^{16}$ to $1\times10^{18}$ atoms/cm$^3$. This p$^-$-type polysilicon film is then subjected to a patterning process to thereby form the patterned p$^-$-type polysilicon film 131 on the insulating film 102b, as shown in FIG. 8A.

Next, the gate oxide film 132 with a thickness of 5 to 20 nm is formed on the patterned polysilicon film 131 by thermal oxidation. The gate electrode 134 is then formed on the gate oxide film 132 by patterning an n$^+$-type polysilicon film with a thickness of 50 to 200 nm. The state at this stage is shown in FIG. 8A.

Figure 8B:
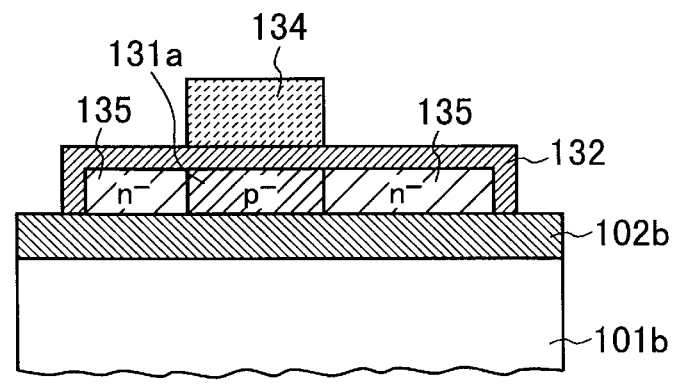

Subsequently, using the gate electrode 134 as a mask, phosphorus (P) as an n-type impurity is selectively doped into the patterned polysilicon film 131 by ion-implantation, thereby forming n$^-$-type polysilicon regions 135 with a doping concentration of $1\times10^{18}$ to $1\times10^{19}$ atoms/cm$^3$, as shown in FIG. 8B. The part 131a of the patterned polysilicon film 131 remains undoped. The part 131a of the patterned polysilicon film 131 serves as the channel region. The state at this stage is shown in FIG. 8B.

Figure 8C:
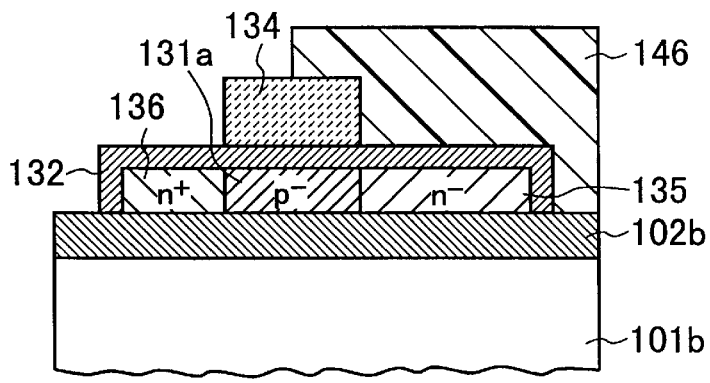

Further, using a patterned photoresist film 146 and the gate electrode 134 as a mask, phosphorus as an n-type dopant is selectively doped into the n$^-$-type polysilicon region 135 located on the left-hand side by ion-implantation, resulting in the n$^+$-type polysilicon region 136 serving as the source region, as shown in FIG. 8C.

Figure 8D:
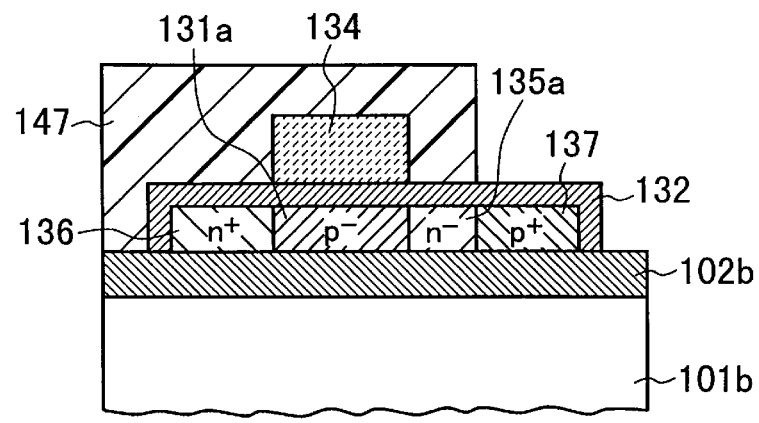
Figure 9:
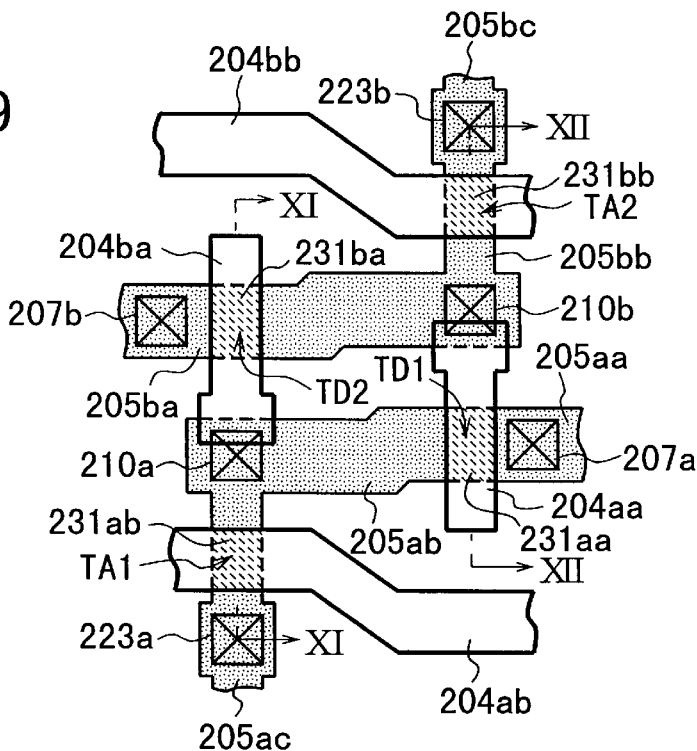
FIG. 9 is a plan view of a memory cell of an SRAM according to a third embodiment of the present invention, in which an upper-layer structure is shown.
Figure 10:
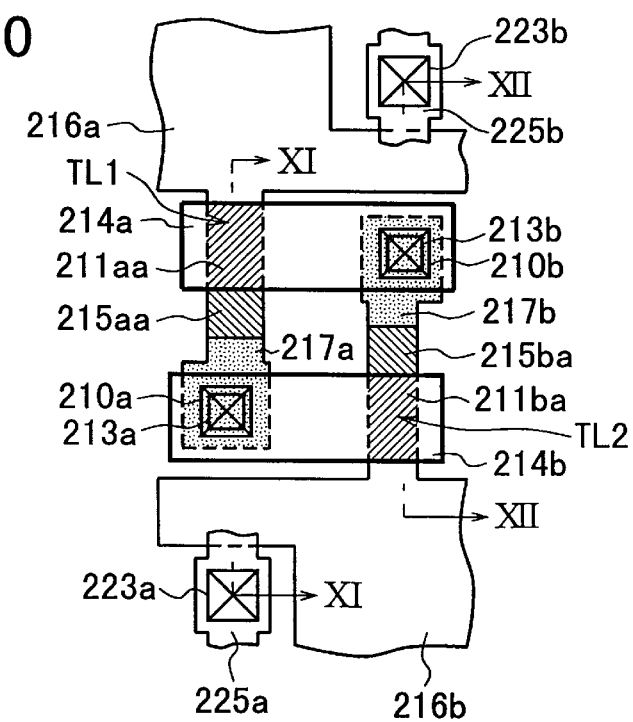
FIG. 10 is a plan view of the memory cell of an SRAM according to the third embodiment of the present invention, in which a lower-layer structure is shown.

After the photoresist film 146 is removed, as shown in FIG. 8D, using a patterned photoresist film 147 as a mask, Boron (B) as a p-type dopant is selectively doped into the n$^-$-type polysilicon region 135 located on the right-hand side. The edge of the mask 147 on the right-hand side is placed over the region 135. Therefore, the p$^+$-type polysilicon region 137 is formed in the n$^-$-type polysilicon region 135 and at the same time, the part 135a of the n$^-$-type polysilicon region 135 remains undoped.

The p$^+$-type polysilicon region 137 serves as the second drain region. The n$^-$-type polysilicon region 135a serves as the first drain region and the offset region.

Thus, the n-channel TFT according to the second embodiment as shown in FIG. 7 is completed.

With the n-channel TFT according to the second embodiment as shown in FIG. 7, there are the same advantages as those in the first embodiment in FIG. 2. Specifically, this TFT has a higher ON current and a lower OFF current and an improved offset-length dependence of the ON current compared with the conventional TFT having the LDO structure in FIG. 1D.

In the n-channel TFT according to the second embodiment as shown in FIG. 7, the patterned p$^-$-type polysilicon film is used as the basic material and the gate electrode 134 is formed by the patterned n$^+$-type polysilicon film. However, this TFT is not limited to these materials, Similar to the p-channel TFT according to the first embodiment, a patterned n$^-$-type polysilicon film having a doping concentration of $1\times10^{16}$ to $1\times10^{18}$ atoms/cm$^3$, which is lower than that of the n$^-$-type polysilicon region 135a serving as the offset and second drain regions, may be used as the basic material.

A patterned p$^-$- or n$^-$-type polycrystalline film made of a mixed crystal of silicon (Si) and germanium (Ge) may be used as the basic material.

The gate electrode 134 may be made any material such as polycide, p$^+$-type polysilicon, silicide, and refractory metal.

Any other substrate such as a glass substrate may be used as the substrate 101b. In the case of the glass substrate, a patterned p$^-$-type amorphous silicon film having a doping concentration of $1\times10^{16}$ to $1\times10^{18}$ atoms/cm$^3$ or a patterned p$^-$- or n$^-$-type polycrystalline film made of a mixed crystal of silicon (Si) and germanium (Ge) may be used as the basic material.

This TFT may be of the bottom gate type, in which there are the same advantages as those of TFT of the top gate type.

Third Embodiment

A memory cell of an SRAM according to a third embodiment of the present invention is shown in FIGS. 9, 10, 11, and 12. This memory cell has an equivalent circuit as shown in FIG. 19.

Figure 19:
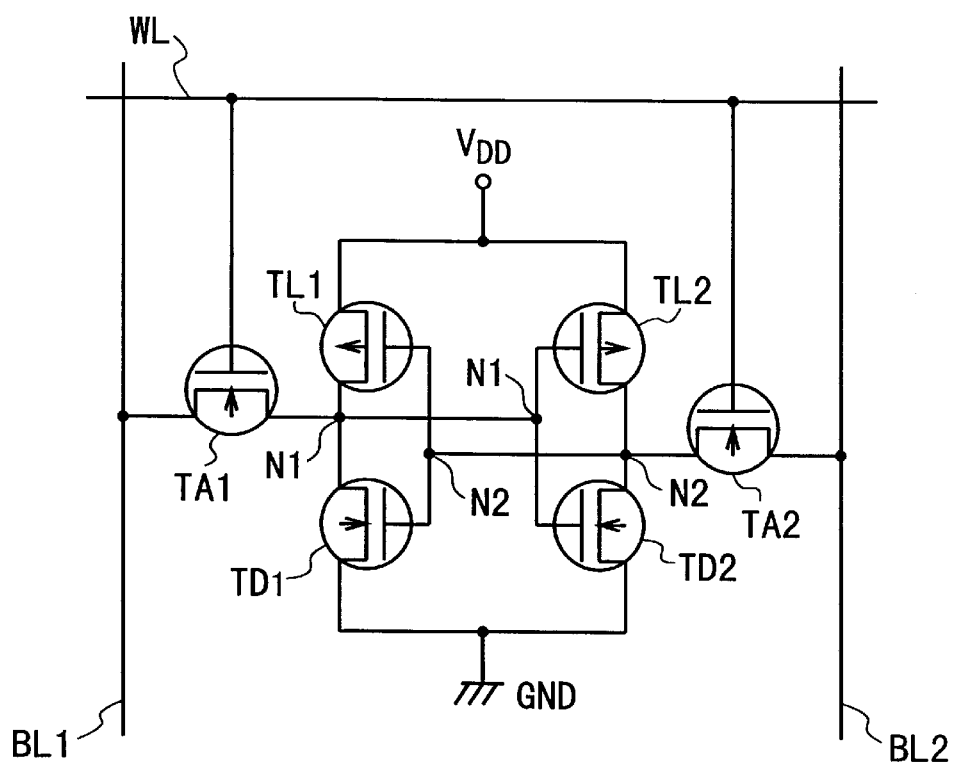
FIG. 19 is a circuit diagram of the memory cell according to the third and fourth embodiments in FIGS. 9 and 14.

As shown in FIG. 19, this memory cell is comprised of two n-channel access MOS transistors TA1 and TA2, two n-channel driver MOS transistors TD1 and TD2, and two p-channel load MOS transistors TL1 and TL2. The first driver transistor TD1 and the first load transistor TL1 constitute a first inverter and the second driver transistor TD2 and the second load transistor TL2 constitute a second inverter. The first and second inverters are cross-coupled at two nodes N1 and N2.

Source regions of the first and second driver transistors TD1 and TD2 are connected to a ground line GND. Source regions of the first and second load transistors TL1 and TL2 are connected to a power supply line V$_{DD}$. One of a pair of source/drain regions of the first access transistor TA1 and one of a pair of source/drain regions of the second access transistor TA2 are connected to a pair of bit lines BL1 and BL2, respectively. Another of the pair of source/drain regions of the first access transistor TA1 and another of the pair of source/drain regions of the second access transistor TA2 are connected to the nodes N1 and N2, respectively. Gate electrodes of the first and second load transistors TL1 and TL2 are connected to a common word line WL.

In the memory cell according to the third embodiment, the top-gate type p-channel TFT according to the first embodiment in FIG. 2 is used as each of the first and second load transistors TL1 and TL2.

Figure 11:
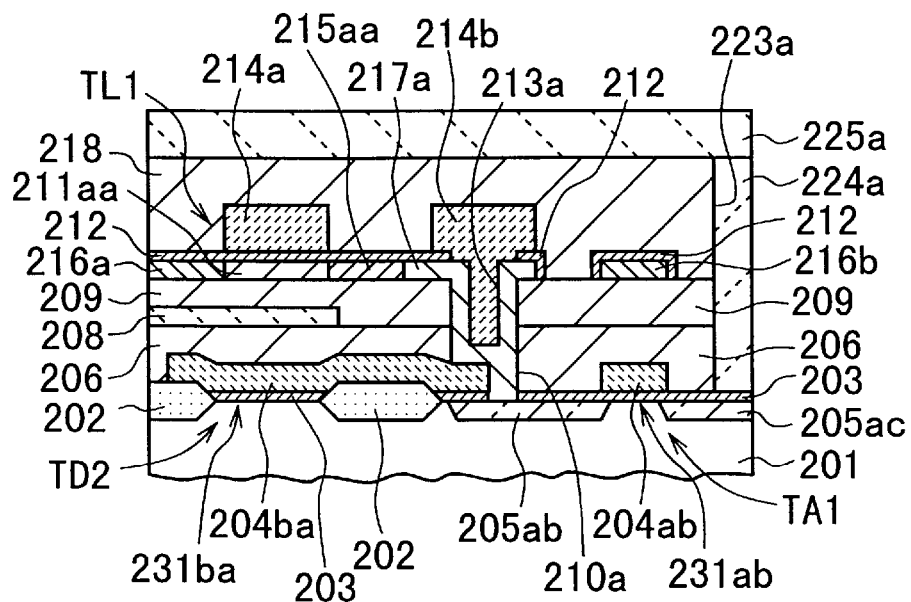
FIG. 11 is a cross-sectional view along the line XI—XI in FIGS. 9 and 10.
Figure 12:
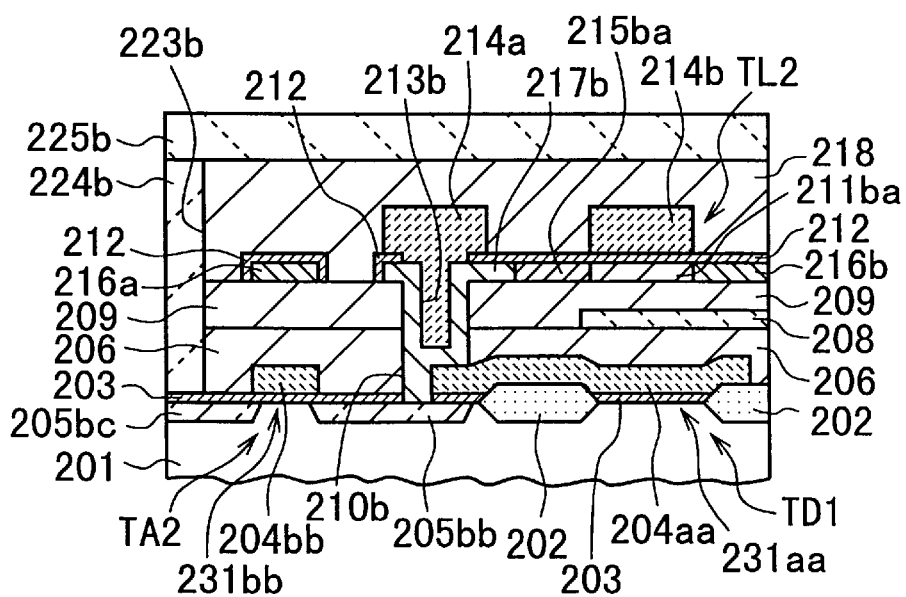
FIG. 12 is a cross-sectional view along the line XII—XII in FIGS. 9 and 10.

As shown in FIGS. 11 and 12, a field oxide film 202 is formed on a main surface of a p-type silicon substrate 201, thereby defining device regions in which the first and second access transistors TA1 and TA2 and the first and second driver transistors TD1 and TD2 are formed. Gate oxide films 203 with a thickness of approximately 10 nm are formed on the surfaces of the device regions. The substrate 201 has a doping concentration of $1\times10^{16}$ to $1\times10^{18}$.

A p-type well, which is formed in the surface of a p- or n-type silicon substrate, nay be used instead of the p-type silicon substrate 201.

Gate electrodes 204aa, 204ab, 204ba, and 204bb are formed on the gate oxide films 203, respectively. These gate electrodes 204aa, 204ab, 204ba, and 204bb are formed by a patterned tungsten polycide film with two stacked subfilms. As these two subfilms, for example, an n$^+$-type polysilicon subfilm with a thickness of approximately 100 nm and a tungsten silicide subfilm with a thickness of approximately 100 nm may be used.

N$^+$-type diffusion regions 205aa, 205ab, 205ac, 205ba, 205bb, and 205bc are formed in the device regions of the p-type silicon substrate 201 in self alignment with the corresponding gate electrodes 204aa, 204ab, 204ba, and 204bb and the field oxide film 202, respectively. These diffusion regions 205aa, 205ab, 205ac, 205ba, 205bb, and 205bc have a doping concentration in the order of $10^{20}$ to $10^{21}$ atoms/cm$^3$.

The first driver transistor TD1 is composed of the gate electrode 204aa, the gate oxide film 203, the n$^+$-type diffusion region 205aa serving as a source region, and the n$^+$-type diffusion region 205ab serving as a drain region. The second driver transistor TD2 is composed of the gate electrode 204ba, the gate oxide film 203, the n$^+$-type diffusion region 205ba serving as a source region, and the n$^+$-type diffusion region 205bb serving as a drain region.

The first access transistor TA1 is composed of the gate electrode 204ab, the gate oxide film 203, the n$^+$-type diffusion region 205ac serving as one of a pair of source/drain regions, and the n$^+$-type diffusion region 205ab serving as another of the pair of source/drain regions. The second access transistor TA2 is composed of the gate electrode 204bb, the gate oxide film 203, the n$^+$-type diffusion region 205bc serving as one of a pair of source/drain regions, and the n$^+$-type diffusion region 205bb serving as another of the pair of source/drain regions.

The n$^+$-type diffusion region 205ab is commonly used by the first driver transistor TD1 and the first access transistor TA1. The n$^+$-type diffusion region 205bb is commonly used by the second driver transistor TD2 and the second access transistor TA2.

The gate electrodes 204ab and 204bb, which serve as the common word line WL, are electrically connected to one another outside the memory cell.

An interlayer insulating film 206 is formed on the substrate 201 to cover the first and second driver transistors TD1 and TD2 and the first and second access transistors TA1 and TA2. The interlayer insulating film 206, which has a flat upper surface, includes a silicon dioxide subfilm located at the bottom of the film 206. For example, the interlayer insulating film 206 is formed by a silicon dioxide film with a thickness of approximately 100 nm located at a lower level and a BPSG subfilm located at an upper level. The film 206 has the minimum thickness of approximately 200 nm and the maximum thickness of approximately 500 nm.

Contact holes 207a and 207b for electrical connection the ground are formed in the interlayer insulating film 206 to vertically extend to the $n^+$-type diffusion regions 205aa and 205ba, respectively. The $n^+$-type diffusion regions 205aa and 205ba are electrically connected to a wiring film 208 for the ground formed on the interlayer insulating film 206. The wiring film 208 is formed by a tungsten polycide film including two stacked subfilms of an n-type polysilicon subfilm with a thickness of approximately 100 nm and a tungsten silicide subfilm with a thickness of approximately 100 nm.

An interlayer insulating film 209 is formed on the interlayer insulating film 206 to cover the wiring film 208. The interlayer insulating film 209, which has a flat upper surface, includes a silicon dioxide subfilm located at the top of the film 209. For example, the interlayer insulating film 209 is formed by a silicon dioxide film with a thickness of approximately 100 nm located at an upper level and a BPSG subfilm located at a lower level. The film 209 has a thickness of approximately 200 nm at the locations just over the wiring film 208 for the ground.

Contact holes 210a and 210b for electrical connection to the nodes N1 and N2 are formed in the interlayer insulating films 209 and 206 and the gate oxide film 203. The contact hole 210a vertically extends to the $n^+$-type diffusion regions 205ab and the gate electrode 204ba. The contact hole 210b vertically extends to the $n^+$-type diffusion regions 205bb and the gate electrode 204aa.

First and second patterned $n^-$-type polysilicon films (not shown in FIGS. 9 to 12) with a thickness of approximately 10 to 100 nm, which are used as the basic materials for the first and second p-channel TFTs serving as the first and second load MOS transistors TL1 and TL2, are formed on the interlayer insulating film 209. The first patterned $n^-$-type polysilicon film extends to the $n^+$-type diffusion region 205ab and the gate electrode 204ba through the contact hole 210a. The second patterned $n^-$-type polysilicon film extends to the $n^+$-type diffusion region 205bb and the gate electrode 204aa through the contact hole 210b.

The first p-channel TFT serving as the first load MOS transistor TL1 and the second p-channel TFT serving as the second load MOS transistor TL2 are formed by the first and second patterned $n^-$-type polysilicon films, respectively. Almost all the first and second p-channel TFTs are located on the interlayer insulating film 209.

In the first patterned $n^-$-type polysilicon film, a $p^+$-type polysilicon region 216a serving as a source region, an $n^-$-type polysilicon region 211aa serving as a channel region, a $p^-$-type polysilicon region 215aa serving as a first drain region and an offset region, and an $n^+$-type polysilicon region 217a serving as a second drain region are formed to be arranged to be adjacent one another. The $p^+$-type polysilicon source region 216a, the $n^-$-type polysilicon channel region 211a, and the $p^-$-type polysilicon first drain (and offset) region 215aa are located on the interlayer insulating film 209. The $n^+$-type polysilicon source region 217a is located on the interlayer insulating film 209 and extends to the inside of the contact hole 210a. The source region 217a is connected to the $n^+$-type diffusion region 205ab and the gate electrode 204ba in the contact hole 210a. The $n^+$-type polysilicon source region 217a covers the inner surface of the contact hole 210a.

Similarly, in the second patterned $n^-$-type polysilicon film, a $p^+$-type polysilicon region 216b serving as a source region, an $n^-$-type polysilicon region 211ba serving as a channel region, a $p^-$-type polysilicon region 215ba serving as a first drain region and an offset region, and an $n^+$-type polysilicon region 217b serving as a second drain region are formed to be arranged to be adjacent one another. The $p^+$-type polysilicon source region 216b, the $n^-$-type polysilicon channel region 211ba, and the $p^-$-type polysilicon first drain (and offset) region 215ba are located on the interlayer insulating film 209. The $n^+$-type polysilicon source region 217b is located on the interlayer insulating film 209 and extends to the inside of the contact hole 210b. The source region 217b is connected to the $n^+$-type diffusion region 205bb and the gate electrode 204aa in the contact hole 210b. The $n^+$-type polysilicon source region 217b covers the inner surface of the contact hole 210b.

For example, the offset length, which is defined as the length between the opposing edges of the $n^-$-type polysilicon channel region 211a (or, 211b) and the $p^-$-type polysilicon offset region 217a (or, 217b) is approximately equal to 0.3 to 0.6 μm.

The $p^+$-type polysilicon source regions 217a and 217b are connected in common to the power supply line $V_{DD}$ one another outside the memory cell.

The $p^+$-type polysilicon source regions 216a and 216b have a doping concentration in the order of $10^{19}$ to $10^{21}$ atoms/cm$^3$. The $n^-$-type polysilicon channel regions 211aa and 211ba have a doping concentration in the order of $10^{16}$ to $10^{18}$ atoms/cm$^3$. The $p^-$-type polysilicon first drain (offset) regions 215a and 215b have a doping concentration in the order of $10^{18}$ to $10^{19}$ atoms/cm$^3$. The $n^+$-type polysilicon second drain region 217a and 217b have a doping concentration in the order of $10^{18}$ to $10^{21}$ atoms/cm$^3$. These doping concentrations are determined corresponding to those of the first and second patterned $n^-$-type polysilicon films.

The doping concentrations of the first and second patterned $n^-$-type polysilicon films are typically set as approximately $10^{16}$ to $10^{18}$ atoms/cm$^3$. For example) the first and second patterned $n^-$-type polysilicon films have a doping concentration of $1\times10^{17}$ atoms/cm$^3$, the doping concentration of the $n^-$-type polysilicon channel regions 211aa and 211ba is $1\times10^{17}$ atoms/cm$^3$. Therefore, the doping concentration of the $p^-$-type polysilicon first drain (offset) regions 215aa and 215ba is $1\times10^{18}$ atoms/cm$^3$, the doping concentration of the $p^+$-type polysilicon source regions 216a and 216b is in the order of $10^{19}$ atoms/cm$^3$, and the $n^+$-type polysilicon second drain region 217a and 217b have a doping concentration in the order of $10^{19}$ atoms/cm$^3$.

In the third embodiment, similar to the first embodiment, a patterned $p^-$-type polysilicon film may be used as the basic material. In this case, it is preferred that the patterned $p^-$-type polysilicon film has a doping concentration less than that of the $p^-$-type polysilicon offset regions 215aa and 215ba. A patterned $p^-$- or $n^-$-type polycrystalline film made of a mixed crystal of silicon (Si) and germanium (Ge) may be used as the basic material.

The exposed surfaces of the first and second $n^-$-type patterned polysilicon films are covered with gate oxide films 212 with a thickness of approximately 5 to 20 nm. The gate oxide films 212 have contact holes 213a and 213b for connection to the nodes N1 and N2. The contact holes 213a and 213b, which are respectively located just over the contact holes 210a and 210b, extend to the n$^+$-type polysilicon drain regions 217a and 217b, respectively. The gate electrode 214a, which covers the n$^-$-type polysilicon region 211aa in self alignment, extends to the contact hole 213b along the surface of the interlayer insulating film 209. The gate electrode 214a is further connected to the n$^+$-type polysilicon drain region 217b. Similarly, the gate electrode 214b, which covers the n$^-$-type polysilicon region 211ba in self alignment, extends to the contact hole 213a along the surface of the interlayer insulating film 209. The gate electrode 214b is further connected to the n$^+$-type polysilicon drain region 217a.

The gate electrodes 214a and 214b is formed by an n$^+$-type polysilicon film with a thickness of approximately 150 nm and a doping concentration in the order of $10^{19}$ to $10^{21}$ atoms/cm$^3$.

In the third embodiment, a gate oxide film covering the surface of the interlayer insulating film 209 together with the first and second n$^-$-type patterned polysilicon films may be used instead of the gate oxide films 212.

The first p-channel TFT is composed of the gate electrode 214a, the gate oxide film 212, the p$^+$-type polysilicon region 216a serving as a source region, the n$^-$-type polysilicon region 211aa serving as a channel region, the p$^-$-type polysilicon region 215aa serving as a first drain region and an offset region, and the n$^+$-type diffusion region 217a serving as a second drain region. The second p-channel TFT is composed of the gate electrode 214b, the gate oxide film 212, the p$^+$-type polysilicon region 216b serving as a source region, the n$^-$-type polysilicon region 211ba serving as a channel region, the p$^-$-type polysilicon region 215ba serving as a first drain region and an offset region, and the n$^+$-type diffusion region 217b serving as a second drain region.

An interlayer insulating film 218 is formed to cover the surface of the interlayer insulating film 209 together with the first and second p-channel TFTs. The interlayer insulating film 218, which has a flat upper surface, includes a silicon dioxide subfilm located at the bottom of the film 218. For example, the interlayer insulating film 218 is formed by a silicon dioxide film with a thickness of approximately 100 nm located at a lower level and a BPSG subfilm located at an upper level. The film 218 has a thickness of approximately 300 nm at the locations just over the gate electrodes 214a and 214b.

Contact holes 223a and 223b for electrical connection to the bit lines BL1 and BL2 are formed in the interlayer insulating films 218, 209 and 206 and the gate oxide film 203. The contact hole 223a vertically extends to the n$^+$-type diffusion regions 205ac. The contact hole 223b vertically extends to the n$^+$-type diffusion regions 205bc. The contact holes 223a and 223b are filled with contact plugs 224a and 224b made of a conductor such as tungsten, respectively.

A pair of bit lines 225a and 225b are formed on the interlayer insulating film 218. The bit lines 225a and 225b correspond to the bit lines BL1 and BL2 in FIG. 19, respectively. The bit lines 225a and 225b are connected to the n$^+$-type diffusion regions 205ac and 205bc through the contact plugs 224a and 224b, respectively.

In the memory cell according to the third embodiment, the gate electrodes 214a and 214b of the p-channel TFTs are not limited to be formed by an n$^+$-type polysilicon film. The gate electrodes 214a and 214b may be formed by n-type polysilicon film or polycide film.

If any means for indirectly connecting the gate electrodes 214a and 214b to the n$^+$-type polysilicon regions 217b and 217a are provided, these gate electrodes 214a and 214b may be made of any material including a p- or p$^+$-type polysilicon film.

As seen from the above explanation, the first and second p-channel TFTs used in the memory cell according to the third embodiment have substantially the same configuration as that of the p-channel TFT according to the first embodiment. Therefore, the first and second TFTs have a higher ON current and a lower OFF current and an improved offset-length dependence of the ON current compared with the conventional TFT having the LDO structure in FIG. 1D.

As a result, with the memory cell according to the third embodiment, high-speed operation, high operation stability at a low-power-supply voltage, and low electric-power dissipation can be realized simultaneously.

Next, a fabrication method of the memory cell according to the third embodiment is explained below with reference to FIGS. 13A to 13E.

Figure 13A:
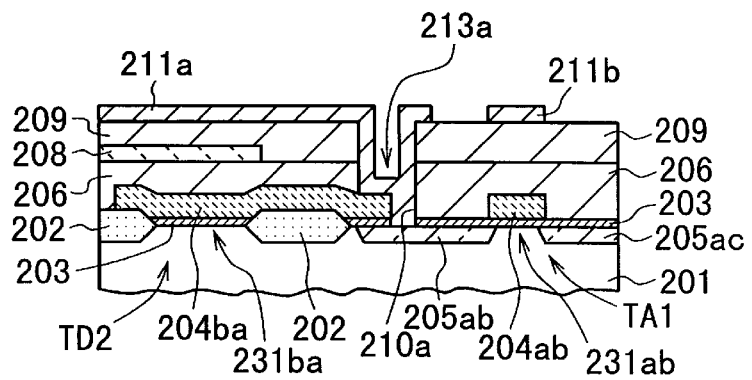
FIGS. 13A to 13E are cross-sectional views of the memory cell according to the third embodiment in FIG. 9, which shows a fabrication method of the cell, respectively.

First, as shown in FIG. 13A, the field oxide film 202 is formed on the main surface of the p-type silicon substrate 201, thereby defining the device regions in which the first and second access transistors TA1 and TA2 and the first and second driver transistors TD1 and TD2 are formed.

The gate oxide films 203 with a thickness of approximately 10 nm are formed on the surfaces of the device regions by thermal oxidation.

An n$^+$-type polysilicon film with a thickness of approximately 100 nm is formed on the substrate 201 over the whole substrate 201 by LPCVD and ion-implantation. A tungsten silicide film with a thickness of approximately 100 nm is formed on n$^+$-type polysilicon film over the whole substrate 201 by sputtering.

The n$^+$-type polysilicon film and the tungsten silicide film thus stacked are then patterned to form the gate electrodes 204aa, 204ab, 204ba, and 204bb on the gate oxide films 203, respectively. These gate electrodes 204aa, 204ab, 204ba, and 204bb are formed by the patterned tungsten polycide film with the two stacked subfilms.

Phosphorus (P) is selectively doped into the device regions by ion implantation using the field oxide film 202 and the gate electrodes 204aa, 204ab, 204ba, and 204bb as a mask. Thus, the n$^+$-type diffusion regions 205aa, 205ab, 205ac, 205ba, 205bb, and 205bc are formed in the device regions of the p-type silicon substrate 201 in self alignment with the corresponding gate electrodes 204aa, 204ab, 204ba, and 204bb and the field oxide film 202, respectively. These diffusion regions 205aa, 205ab, 205ac, 205ba, 205bb, and 205bc have a doping concentration in the order of $10^{20}$ to $10^{21}$ atoms/cm$^3$.

Subsequently, a silicon dioxide film (not shown) with a thickness of approximately 100 nm is formed to cover the gate electrodes 204aa, 204ab, 204ba, and 204bb over the whole substrate 201 by LPCVD. A BPSG film (not shown) with a thickness of approximately 600 nm is formed on the silicon dioxide film by LPCVD. The BPSG film is subjected to a heat treatment at a temperature of 800 to 850° C. to be reflown. The BPSG film is further subjected to Chemical Mechanical Polishing (CMP) to thereby planarize the surface of the BPSG film. Thus, the interlayer insulating film 206 is formed on the substrate 201 to cover the first and second driver transistors TD1 and TD2 and the first and second access transistors TA1 and TA2. The film 206 has the minimum thickness of approximately 200 nm and the maximum thickness of approximately 500 nm.

The contact holes 207a and 207b are formed in the interlayer insulating film 206 to vertically extend to the n+-type diffusion regions 205aa and 205ba by photolithography, respectively.

An n-type polysilicon film with a thickness of approximately 100 nm is formed over the whole substrate 201 by LPCVD and ion implantation. A tungsten silicide film with thickness of approximately 100 nm is formed on the n-type polysilicon film by sputtering. The n-type polysilicon film and the tungsten silicide film thus stacked are patterned to thereby form the wiring film 208 for the ground on the interlayer insulating film 206. This wiring film 208 is connected to the n+-type diffusion regions 205aa and 205ba through the contact holes 207a and 207b, respectively.

Following this process, a BPSG film (not shown) with a thickness of approximately 600 nm is formed on the interlayer insulating film 206 by LPCVD over the whole substrate 201. The BPSG film is subjected to a heat treatment at a temperature of 800 to 850° C. to be reflown. The BPSG film is further subjected to CMP to thereby planarize the surface of the BPSG film. A silicon dioxide film (not shown) with a thickness of approximately 100 nm is formed on the BPSG film by LPCVD. Thus, the interlayer insulating film 209 is formed. The film 209 has a thickness of approximately 200 nm at the locations just over the wiring film 208 for the ground.

The interlayer insulating films 206, 209, and the gate oxide films 203 are selectively etched by photolithography and anisotropically etching, thereby forming the contact holes 210a and 210b for electrical connection to the nodes N1 and N2. The contact hole 210a vertically extends to the n+-type diffusion regions 205ab and the gate electrode 204ba. The contact hole 210b vertically extends to the n+-type diffusion regions 205bb and the gate electrode 204aa.

An undoped amorphous silicon film with a thickness of approximately 10 to 100 nm is formed on the interlayer insulating film 209 by LPCVD over the whole substrate 201. The undoped amorphous silicon film is subjected to a heat treatment at a temperature of approximately 600° C., thereby phase-transferring the amorphous silicon film to a polysilicon film (not shown). Phosphorus is doped into the polysilicon film by ion implantation to form an n−-type polysilicon film. The n−-type polysilicon film has, for example, a doping concentration of $1\times10^{17}$ atoms/cm$^3$.

An n−-type amorphous silicon film may be formed and then, it may be phase-transferred to an n−-type polysilicon film.

The n−-type polysilicon film is patterned by photolithography and anisotropic etching. Thus, the first and second patterned n−-type polysilicon films 211a and 211b are formed on the interlayer insulating film 209. Ends of the first and second patterned n−-type polysilicon films 211a and 211b are located on the interlayer insulating film 209. The other ends of the first and second patterned n−-type polysilicon films 211a and 211b are located in the contact holes 210a and 210b, respectively. The first patterned n−-type polysilicon film 211a is connected to the n+-type diffusion region 205ab and the gate electrode 204ba through the contact hole 210a. The second patterned n−-type polysilicon film 211b is connected to the n+-type diffusion region 205bb and the gate electrode 204aa through the contact hole 210b. The state at this stage is shown in FIG. 13A.

Subsequently, the gate oxide films 212 with a thickness of approximately 5 to 20 nm are formed on the surfaces of the first and second n−-type patterned polysilicon films 211a and 211b by thermal oxidation. By photolithography and anisotropic etching, the contact holes 213a and 213b for connection to the nodes N1 and N2 are formed in the gate oxide films 212. The contact holes 213a and 213b, which are respectively located just over the contact holes 210a and 210b, extend to the ends of the first and second n−-type polysilicon films 211a and 211b, respectively.

Figure 13B:
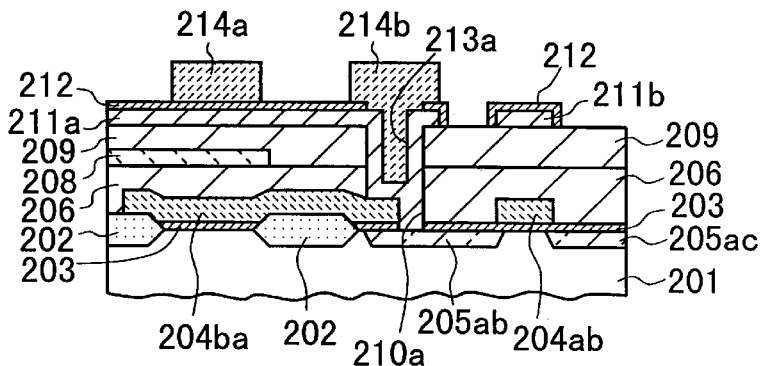

An n+-type polysilicon film (not shown) with a thickness of approximately 150 nm and a doping concentration of approximately $10^{19}$ to $10^{21}$ atoms/cm$^3$ is formed over the whole substrate 201 by LPCVD. The n+-type polysilicon film is patterned by photolithography and anisotropic etching, forming the gate electrode 214a and 214b. The gate electrode 214a covers the part (for the channel region) of the n−-type polysilicon film 211a in self alignment and extends to the contact hole 213b along the surface of the interlayer insulating film 209. The gate electrode 214a is further connected to the n+-type polysilicon film 211b through the contact hole 213b. Similarly, the gate electrode 214b covers the part (for the channel region) of the n−-type polysilicon film 211b in self alignment and extends to the contact hole 213a along the surface of the interlayer insulating film 209. The gate electrode 214b is further connected to the n−-type polysilicon film 211a through the contact hole 213a. The state at this stage is shown in FIG. 13B.

Figure 13C:
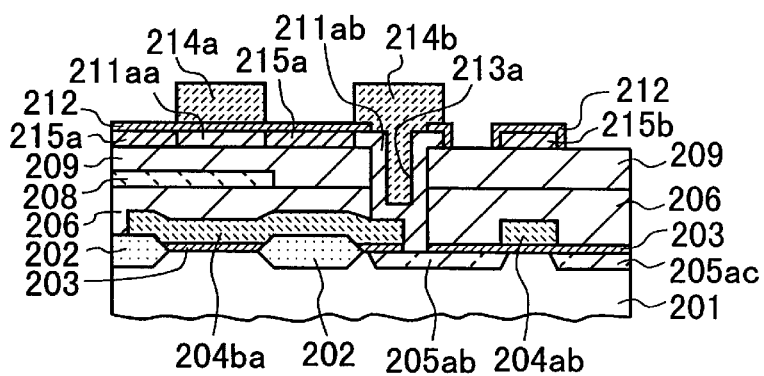

Subsequently, using the gate electrodes 214a and 214b as a mask, boron (B) as a p-type impurity is selectively doped into the n−-type patterned polysilicon films 211a and 211b by ion-implantation. Thus, the p−-type polysilicon regions 215a and 215b are formed in the n−-type patterned polysilicon films 211a and 211b in self alignment with the gate electrodes 214a and 214b. The remaining parts 211aa and 211ba of the patterned polysilicon films 211a and 211b, which are located just below the gate electrodes 214a and 214b, serve as the channel regions. When the patterned polysilicon films 211a and 211b has a doping concentration of $1\times10^{17}$ atoms/cm$^3$, the polysilicon channel regions 211aa and 211ba have the same doping concentration of $1\times10^{17}$ atoms/cm$^3$. Corresponding to this concentration, the polysilicon regions 215a and 215b have a doping concentration of $1\times10^{18}$ atoms/cm$^3$. The state at this stage is shown in FIG. 13C.

Figure 13D:
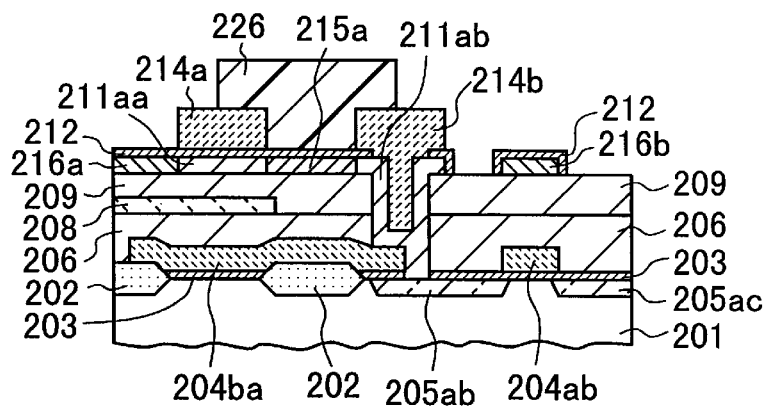

Further, using a patterned photoresist film 226 and the gate electrodes 214a and 214b as a mask, boron (B) or boron fluoride (BF$^2$) as a p-type dopant is selectively doped into the p−-type polysilicon regions 215a and 215b located on the left-hand side of the n−-type patterned polysilicon films 211a and 211b by ion-implantation, resulting in the p+-type polysilicon regions 216a and 216b serving as the source regions. The doping concentration of the p+-type polysilicon regions 216a and 216b is in the order of $10^{19}$ atoms/cm$^3$, which corresponds to the doping concentration of $1\times10^{17}$ atoms/cm$^3$ of the patterned polysilicon films 211a and 211b. The p+-type polysilicon regions 216a and 216b serve as the source regions of the first and second p-channel TFTs. The state at this stage is shown in FIG. 13D.

After the photoresist film 226 is removed, a silicon dioxide film (not shown) with a thickness of approximately 100 nm is formed to cover the gate electrodes 214a and 214b by LPCVD. A BPSG film (not shown) with a thickness of approximately 600 nm is formed on the silicon dioxide film by LPCVD over the whole substrate 201. The BPSG film is subjected to a heat treatment at a temperature of 800 to 850° C. to be reflown. The BPSG film is further subjected to CMP to thereby planarize the surface of the BPSG film. Thus, the interlayer insulating film 218 is formed.

Through these heat treatment processes for the interlayer insulating film 218, the n-type dopant existing in the gate electrode 214b and the n+-type diffusion region 205ab are thermally diffused into the n−-type polysilicon region 211ab and p−-type silicon region 215a. Thus, the n+-type polysilicon region 217a and the p−-type silicon region 215aa are formed in the first patterned polysilicon film 211a. Similarly, the n-type dopant existing in the gate electrode 214a and the n+-type diffusion region 205bb are thermally diffused into the n−-type polysilicon region 211ba and p−-type silicon region 215b. Thus, the n+-type polysilicon region 217b and the p−-type silicon region 215ba are formed in the second patterned polysilicon film 211b.

The doping concentration of the p−-type polysilicon regions 215aa and 215ba is in the order of $10^{18}$ atoms/cm$^3$, which corresponding to the doping concentration of $1\times10^{17}$ atoms/cm$^3$ of the patterned polysilicon films 211a and 211b. The doping concentration of the n+-type polysilicon regions 217a and 217b is in the order of $10^{19}$ atoms/cm$^3$. The p+-type polysilicon regions 215aa and 215ba serve as the offset regions and the first drain regions of the first and second p-channel TFTs. The n+-type polysilicon regions 217a and 217b serve as the second drain regions of the first and second p-channel TFTs. The offset length is approximately 0.3 to 0.6 μm.

Figure 13E:
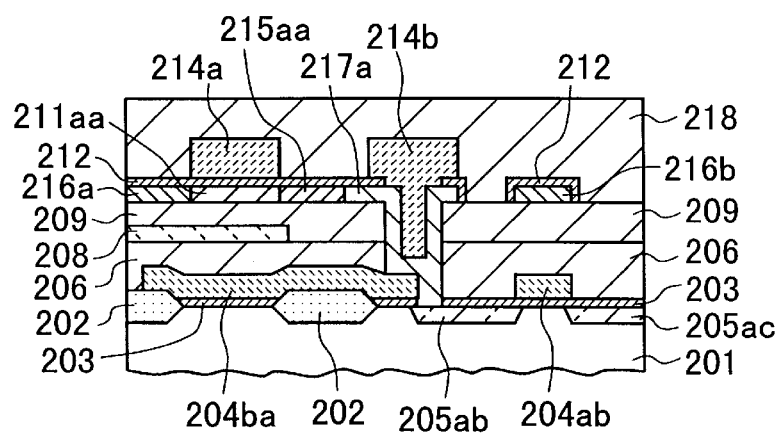
Figure 14:
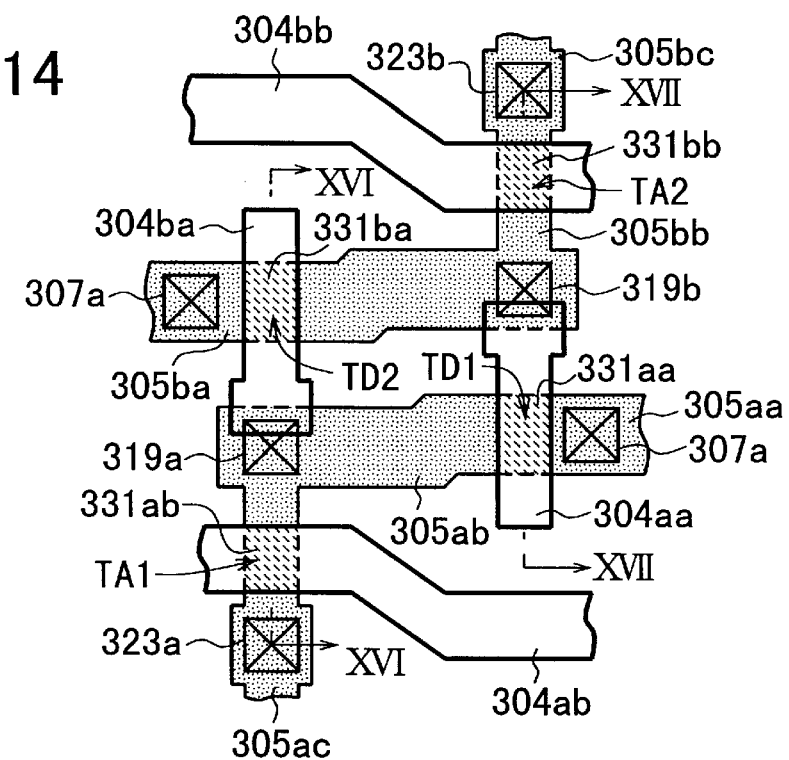
FIG. 14 is a plan view of a memory cell of an SRAM according to a fourth embodiment of the present invention, in which an upper-layer structure is shown.
Figure 15:
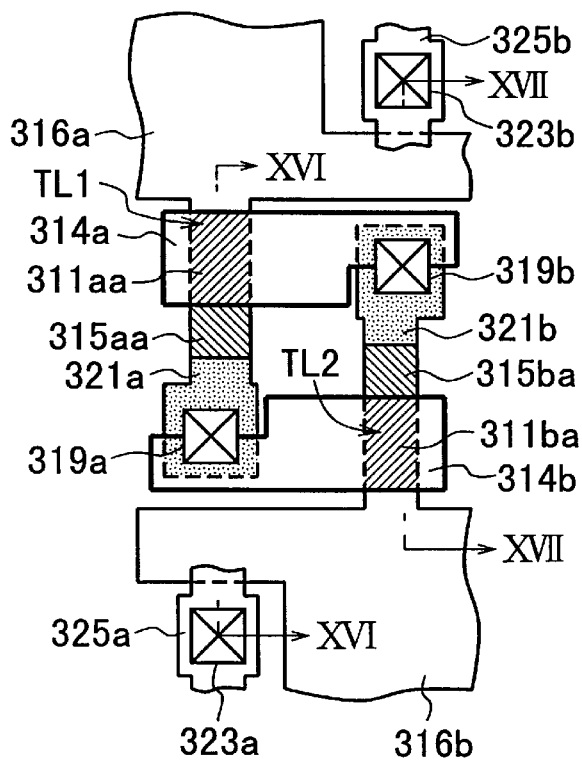
FIG. 15 is a plan view of the memory cell of an SRAM according to the fourth embodiment of the present invention, in which a lower-layer structure is shown.

The formation of the first and second TFTs is completed at this stage, as shown in FIG. 13E.

Unlike the conventional TFT with the LDO structure in FIG. 1D, the offset length of the first and second TFTs in the third embodiment is not dependent upon the fluctuation occurring in the photolithography processes, but is dependent upon the doping concentration of the diffusion regions and the gate electrodes and the heat-treatment processes for forming the interlayer insulating film 218.

Further, the interlayer insulating films 218, 209, and 206, and the gate oxide films 203 are selectively etched by photolithography and anisotropically etching, thereby forming the contact holes 223a and 223b for electrical connection to the bit lines BL1 and BL2. As shown in FIGS. 11 and 12, the contact hole 223a vertically extends to the n+-type diffusion regions 205ac. The contact hole 223b vertically extends to the n+-type diffusion regions 205bc.

A titanium film (not shown) with a thickness of approximately 50 nm and a titanium nitride film (not shown) with a thickness of approximately 100 nm are successively formed on the interlayer insulating film 218 over the whole substrate 201 by sputtering or reactive sputtering. A tungsten film (not shown) is formed on the titanium nitride film over the whole substrate 201 by LPCVD. The tungsten film is then etched back to form the contact holes 223a and 223b. Thus, the contact plugs 224a and 224b filling the contact hole 223a and 223b are formed by these stacked conductive films of titanium, titanium nitride, and tungsten.

An aluminum film (not shown) is formed on the interlayer insulating film 218 over the whole substrate 201. The aluminum film and the underlying titanium nitride and the titanium films are successively patterned by anisotropic etching. Thus, the bit lines 225a and 225b are formed.

Through the above-described process steps, the memory cell of an SRAM according to the third embodiment is completed as shown in FIGS. 9, 10, 11, and 12.

In the memory cell according to the third embodiment, the first and second load MOS transistors TL1 and TL2 are formed by the p-channel TFTs of the top-gate type. However, p-channel TFTs of the bottom-gate type may be used. In this case, the gate electrodes of the first and second TFTs are formed by n- or n+-type polysilicon films. The gate electrodes are connected to the gate electrodes of the first and second n-channel MOS transistors and the drain region of the first n-channel MOS transistor through the lower-level second and first node contact holes, respectively.

The first and second patterned polysilicon films for forming the first and second TFTs may be made of the same material as that of the third embodiment. The n- or n−-type polysilicon regions serving as the second drain regions, which are located at the ends of the first and second patterned polysilicon films, are connected to the gate electrodes of the second and first p-channel TFTs through the first and second upper-level node contact holes, respectively.

The memory cell of an SRAM including the bottom-gate type TFTs according to the invention has the same advantages as those in the third embodiment compared with the memory cell using the conventional TFTs with the LDO structure.

Fourth Embodiment

A memory cell of an SRAM according to a fourth embodiment of the present invention is shown in FIGS. 13, 14, 15, and 16. This memory cell has an equivalent circuit as shown in FIG. 19.

In the memory cell according to the fourth embodiment, similar to the memory cell according to the third embodiment, the top-gate type p-channel TFT according to the first embodiment in FIG. 2 is used as each of the first and second load transistors TL1 and TL2. However, different from the third embodiment, a single contact hole is provided for each TFT.

Figure 16:
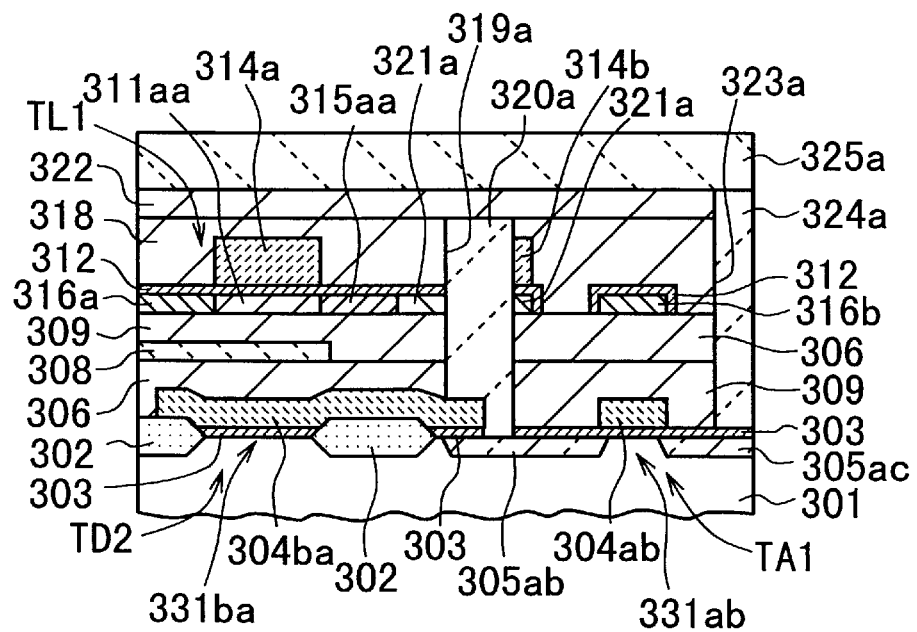
FIG. 16 is a cross-sectional view along the line XVI—XVI in FIGS. 14 and 15.
Figure 17:
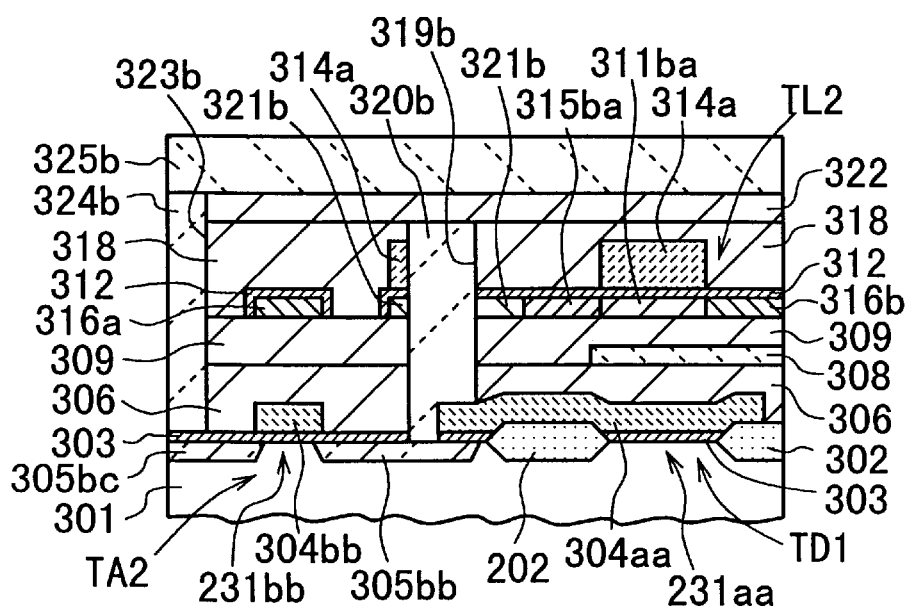
FIG. 17 is a cross-sectional view along the line XVII—XVII in FIGS. 14 and 15.

As shown in FIGS. 16 and 17, a field oxide film 302 is formed on a main surface of a p-type silicon substrate 301, thereby defining device regions in which the first and second access transistors TA1 and TA2 and the first and second driver transistors TD1 and TD2 are formed. Gate oxide films 303 are formed on the surfaces of the device regions.

Gate electrodes 304aa, 304ab, 304ba, and 304bb are formed on the gate oxide films 303, respectively. These gate electrodes 304aa, 304ab, 304ba, and 304bb are formed by a patterned tungsten polycide film with two stacked sub-films.

N+-type diffusion regions 305aa, 305ab, 305ac, 305ba, 305bb, and 305bc are formed in the device regions of the p-type silicon substrate 301 in self alignment with the corresponding gate electrodes 304aa, 304ab, 304ba, and 304bb and the field oxide film 302, respectively. These diffusion regions 305aa, 305ab, 305ac, 305ba, 305bb, and 305bc have a doping concentration in the order of $10^{20}$ to $10^{21}$ atoms/cm$^−$.

The first driver transistor TD1 is composed of the gate, electrode 304aa, the gate oxide film 303, the n+-type diffusion region 305aa serving as a source region, and the n+-type diffusion region 305ab serving as a drain region. The second driver transistor TD2 is composed of the gate electrode 304ba, the gate oxide film 303, the n+-type diffusion region 305ba serving as a source region, and the n+-type diffusion region 305bb serving as a drain region.

The first access transistor TA1 is composed of the gate electrode 304ab, the gate oxide film 303, the n+-type diffusion region 305ac serving as one of a pair of source/drain regions, and the n+-type diffusion region 305ab serving as another of the pair of source/drain regions. The second access transistor TA2 is composed of the gate electrode 304bb, the gate oxide film 303, the n+-type diffusion region 305bc serving as one of a pair of source/drain regions, and the n+-type diffusion region 305bb serving as another of the pair of source/drain regions.

The n⁺-type diffusion region 305ab is commonly used by the first driver transistor TD1 and the first access transistor TA1. The n⁺-type diffusion region 305bb is commonly used by the second driver transistor TD2 and the second access transistor TA2.

The gate electrodes 204ab and 204bb, which serve as the common word line WL, are electrically connected to one another outside the memory cell.

An interlayer insulating film 306 is formed on the substrate 301 to cover the first and second driver transistors TD1 and TD2 and the first and second access transistors TA1 and TA2. The interlayer insulating film 306, which has a flat upper surface, includes a silicon dioxide subfilm located at the bottom of the film 306.

Contact holes 307a and 307b for electrical connection to the ground are formed in the interlayer insulating film 306 to vertically extend to the n⁺-type diffusion regions 305aa and 305ba, respectively. The n⁺-type diffusion regions 305aa and 305ba are electrically connected to a wiring film 308 for the ground formed on the interlayer insulating film 306.

An interlayer insulating film 309 is formed on the interlayer insulating film 306 to cover the wiring film 308. The interlayer insulating film 309, which has a flat upper surface, includes a silicon dioxide subfilm located at the top of the film 309.

First and second patterned n⁻-type polysilicon films (not shown in FIGS. 14 to 17), which are used as the basic materials for the first and second p-channel TFTs serving as the first and second load MOS transistors TL1 and TL2, are formed on the interlayer insulating film 309.

In the first patterned n⁻-type polysilicon film, a p⁺-type polysilicon region 316a serving as a source region, an n⁻-type polysilicon region 311aa serving as a channel region, a p⁻-type polysilicon region 315aa serving as a first drain region and an offset region, and an n⁺-type polysilicon region 321a serving as a second drain region are formed to be arranged to be adjacent one another. At least part of the n⁺-type polysilicon region 321a (i.e., the second drain region) is located just over the connection part of the gate electrode 304ba and the n⁺-type diffusion region 305ab through the interlayer insulating films 309 and 306.

Similarly, in the second patterned n⁻-type polysilicon film, a p⁺-type polysilicon region 316b serving as a source region, an n⁻-type polysilicon region 311ba serving as a channel region, a p⁻-type polysilicon region 315ba serving as a first drain region and an offset region, and an n⁺-type polysilicon region 321b serving as a second drain region are formed to be arranged to be adjacent one another. At least part of the n⁺-type polysilicon region 321b (i.e., the second drain region) is located just over the connection part of the gate electrode 304aa and the n⁺-type diffusion region 305bb through the interlayer insulating films 309 and 306.

For example, the offset length, which is defined as the length between the opposing edges of the n⁻-type polysilicon channel region 311a (or, 311b) and the p⁻-type polysilicon offset region 321a (or, 321b) is approximately equal to 0.3 to 0.6 μm.

The p⁺-type polysilicon source regions 316a and 316b are connected in common to the power supply line $V_{DD}$ one another outside the memory cell.

The p⁺-type polysilicon source regions 316a and 316b have a doping concentration in the order of $10^{19}$ to $10^{21}$ atoms/cm³. The n⁻-type polysilicon channel regions 311aa and 311ba have a doping concentration in the order of $10^{16}$ to $10^{18}$ atoms/cm³. The p⁻-type polysilicon first drain (offset) regions 315a and 315b have a doping concentration in the order of $10^{18}$ to $10^{19}$ atoms/cm³. The n⁺-type polysilicon second drain region 321a and 321b have a doping concentration in the order of $10^{18}$ to $10^{21}$ atoms/cm³. These doping concentrations are determined corresponding to those of the first and second patterned n⁻-type polysilicon films.

The doping concentrations of the first and second patterned n⁻-type polysilicon films are typically set as approximately $10^{16}$ to $10^{18}$ atoms/cm³. For example, the first and second patterned n⁻-type polysilicon films have a doping concentration of $1\times10^{17}$ atoms/cm³, the doping concentration of the n⁻-type polysilicon channel regions 311aa and 311ba is $1\times10^{17}$ atoms/cm³. Therefore, the doping concentration of the p⁻-type polysilicon first drain (offset) regions 315aa and 315ba is $1\times10^{18}$ atoms/cm³, the doping concentration of the p⁺-type polysilicon source regions 316a and 316b is in the order of $10^{19}$ atoms/cm³, and the n⁺-type polysilicon second drain region 321a and 321b have a doping concentration in the order of $10^{19}$ atoms/cm³.

In the fourth embodiment, similar to the third embodiment, a patterned p⁻-type polysilicon film may be used as the basic material. In this case, it is preferred that the patterned p⁻-type polysilicon film has a doping concentration less than that of the p⁻-type polysilicon offset regions 321aa and 321ba. A patterned p⁻- or n⁻-type polycrystalline film made of a mixed crystal of silicon (Si) and germanium (Ge) may be used as the basic material.

The exposed surfaces of the first and second n⁻-type patterned polysilicon films are covered with gate oxide films 312 with a thickness of approximately 5 to 20 nm. The gate electrode 314a, which covers the n⁻-type polysilicon region 311aa in self alignment, extends along the surface of the interlayer insulating film 309 to the location just over the connection part of the gate electrode 304aa and the n⁺-type diffusion region 305bb. Similarly, the gate electrode 31ba, which covers the n⁻-type polysilicon region 311ba in self alignment, extends along the surface of the interlayer insulating film 309 to the location just over the connection part of the gate electrode 304ba and the n⁺-type diffusion region 305ab.

The gate electrodes 314a and 314b is formed by an n- or n⁺-type polysilicon film with a thickness of approximately 150 nm and a doping concentration in the order of $10^{16}$ to $10^{21}$ atoms/cm³.

In the fourth embodiment, a gate oxide film covering the surface of the interlayer insulating film 309 together with the first and second n⁻-type patterned polysilicon films may be used instead of the gate oxide films 312.

The first p-channel TFT is composed of the gate electrode 314a, the gate oxide film 312, the p⁺-type polysilicon region 316a serving as a source region, the n⁻-type polysilicon region 311aa serving as a channel region, the p⁻-type polysilicon region 315aa serving as a first drain region and an offset region, and the n⁺-type diffusion region 321a serving as a second drain region. The second p-channel TFT is composed of the gate electrode 314b, the gate oxide film 312, the p⁺-type polysilicon region 316b serving as a source region, the n⁻-type polysilicon region 311ba serving as a channel region, the p⁻-type polysilicon region 315ba serving as a first drain region and an offset region, and the n⁺-type diffusion region 321b serving as a second drain region.

An interlayer insulating film 318 is formed to cover the surface of the interlayer insulating film 309 together with the first and second p-channel TFTs. The interlayer insulating film 318, which has a flat upper surface, includes a silicon dioxide subfilm located at the bottom of the film 318. For example, the interlayer insulating film 318 is formed by a silicon dioxide film with a thickness of approximately 100 nm located at a lower level and a BPSG subfilm located at an upper level. The film 318 has a thickness of approximately 300 nm at the locations just over the gate electrodes 314a and 314b.

A contact hole 319a (a first node contact hole) is formed to extend from the surface of the interlayer insulating film 318 to the gate electrode 304ba and the n$^+$-diffusion region 305ab. The contact hole 319a penetrates vertically the interlayer insulating film 318, the gate electrode 314b, the gate oxide film 312, the n$^+$-diffusion region 321a, the interlayer insulating films 309 and 306, and the gate oxide film 303 to the connection part of the gate electrode 304ba and the n$^+$-diffusion region 305ab.

Similarly, a contact hole 319b (a second node contact hole) is formed to extend from the surface of the interlayer insulating film 318 to the gate electrode 304aa and the n$^+$-diffusion region 305bb. The contact hole 319b penetrates vertically the interlayer insulating film 318, the gate electrode 314a, the gate oxide film 312, the n$^+$-diffusion region 321b, the interlayer insulating films 309 and 306, and the gate oxide film 303 to the connection part of the gate electrode 304aa and the n$^+$-diffusion region 305bb.

The contact holes 319a and 319b are filled with contact plugs 320a and 320b, respectively. The contact plugs 320a and 320b are formed by an n$^+$-type polysilicon film with a doping concentration in the order of $10^{19}$ to $10^{21}$ atoms/cm$^3$. In this fourth embodiment, the node connection of the memory cell is conducted with the contact plugs 320a and 320b.

The material for the contact plugs 320a and 320b is not limited to the n$^+$-type polysilicon film and it may be any one of non-silicon conductive films. In this case, the material for the gate electrode 314a and 314b is not limited to the n- or n$^+$-type polysilicon film and it may be any one of conductive films. However, the formation method of the n$^+$-type polysilicon regions 321a and 321b serving as the second drain regions of the first and second p-channel TFTs is different in the cases where the contact plugs 320a and 320b are formed by the n$^+$-type polysilicon film and the non-silicon conductive film.

An interlayer insulating film 322 is formed to cover the surface of the interlayer insulating film 318 together with the top parts of the contact plugs 320a and 320b. The interlayer insulating film 322, which has a flat upper surface, is formed by a silicon dioxide film or BPSG film with a thickness of approximately 20 nm.

Contact holes 323a and 323b (bit contact holes) for electrical connection to the bit lines BL1 and BL2 are formed to penetrate vertically the interlayer insulating films 322, 318, 309 and 306 and the gate oxide film 303 to the n$^+$-type diffusion regions 305ac and 305bc, respectively. The contact holes 323a and 323b are filled with contact plugs 324a and 324b made of a conductor such as tungsten, respectively.

A pair of bit lines 325a and 325b are formed on the interlayer insulating film 322. The bit lines 325a and 325b correspond to the bit lines BL1 and BL2 in FIG. 19, respectively. The bit lines 325a and 325b are connected to the n$^+$-type diffusion regions 305ac and 305bc through the contact plugs 324a and 324b, respectively.

Similar to the memory cell according to the third embodiment, the first and second p-channel TFTs used in the memory cell according to the fourth embodiment have substantially the same configuration as that of the p-channel TFT according to the first embodiment. Therefore, the first and second TFTs have a higher ON current and a lower OFF current and an improved offset-length dependence of the ON current compared with the conventional TFT having the LDO structure in FIG. 1D.

As a result, with the memory cell according to the fourth embodiment, high-speed operation, high operation stability at a low-power-supply voltage, and low electric-power dissipation can be realized simultaneously.

Additionally, the memory cell of an SRAM having the configuration where the first and second p-channel TFTs have the conventional LDO structure and the node contact holes have the same structure as in this fourth embodiment was filed by the inventor and others as the Japanese Patent Application No. 7-282949.

Next, a fabrication method of the memory cell according to the fourth embodiment is explained below with reference to FIGS. 18A to 18E.

Figure 18A:
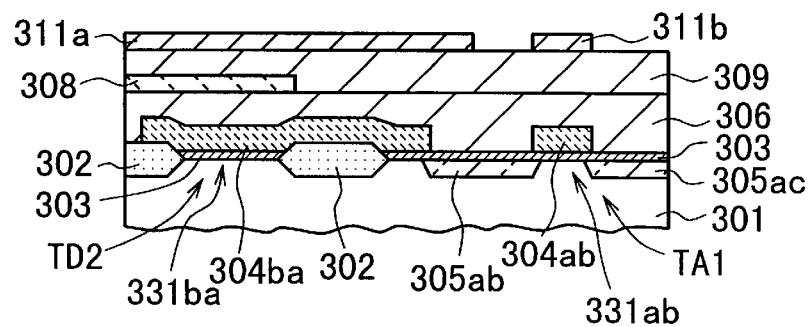
FIGS. 18A to 18E are cross-sectional views of the memory cell according to the fourth embodiment in FIG. 14, which shows a fabrication method of the cell, respectively.

First, as shown in FIG. 18A, the field oxide film 302 is formed on the main surface of the p-type silicon substrate 301, thereby defining the device regions in which the first and second access transistors TA1 and TA2 and the first and second driver transistors TD1 and TD2 are formed The substrate 301 has a doping concentration in the order of $10^{16}$ to $10^{18}$ atoms/cm$^3$. The gate oxide films 303 are formed on the surfaces of the device regions by thermal oxidation. The gate electrodes 304aa, 304ab, 304ba, and 304bb are formed by a tungsten polycide film. The n$^+$-type diffusion regions 305aa, 305ab, 305ac, 305ba, 305bb, and 305bc are formed in the device regions of the p-type silicon substrate 301 in self alignment with the corresponding gate electrodes 304aa, 304ab, 304ba, and 304bb and the field oxide film 302, respectively. These diffusion-regions 305aa, 305ab, 305ac, 305ba, 305bb, and 305bc have a doping concentration in the order of $10^{20}$ to $10^{21}$ atoms/cm$^3$.

Subsequently, a silicon dioxide film (not shown) and a BPSG film (not shown) are successively formed over the substrate 301. The BPSG film is subjected to a heat treatment for reflowing and to CMP for planarizing the surface of the BPSG film. Thus, the interlayer insulating film 306 is formed on the substrate 301 to cover the first and second driver transistors TD1 and TD2 and the first and second access transistors TA1 and TA2.

The contact holes 307a and 307b are formed in the interlayer insulating film 306 to vertically extend to the n$^+$-type diffusion regions 305aa and 305ba by photolithography, respectively.

An n-type polysilicon film with a thickness of approximately 100 nm and a tungsten silicide film with a thickness of approximately 100 nm is formed on the n-type polysilicon film. The n-type polysilicon film and the tungsten silicide film thus stacked are patterned to thereby form the wiring film 308 for the ground on the interlayer insulating film 306. This wiring film 308 is connected to the n$^+$-type diffusion regions 305aa and 305ba through the contact holes 307a and 307b, respectively.

Following this process, a BPSG film (not shown) is formed on the interlayer insulating film 306 over the whole substrate 301. The BPSG film is subjected to a heat treatment for reflowing and CMP to thereby planarize the surface of the BPSG film. A silicon dioxide film (not shown) is formed on the BPSG film over the whole substrate 301. Thus, the interlayer insulating film 309 is formed.

An n$^-$-type polysilicon film (not shown) with a thickness of approximately 10 to 100 nm is formed on the interlayer insulating film 309 by LPCVD and ion implantation over the whole substrate 301. The n⁻-type polysilicon film has, for example, a doping concentration of $1 \times 10^{17}$ atoms/cm³.

The n⁻-type polysilicon film is patterned by photolithography and anisotropic etching. Thus, the first and second patterned n⁻-type polysilicon films 311a and 311b are formed on the interlayer insulating film 309. An end of the first patterned n⁻-type polysilicon film 311a is located at a location just over the connection parts of the gate electrode 304ba and the n⁺-type diffusion region 305ab. An end of the second patterned n⁻-type polysilicon film 311b is located at a location just over the connection parts of the gate electrode 304aa and the n⁺-type diffusion region 305bb. The state at this stage is shown in FIG. 18A.

Subsequently, the gate oxide films 312 with a thickness of approximately 5 to 20 nm are formed on the surfaces of the first and second n⁻-type patterned polysilicon films 311a and 311b by thermal oxidation. An n⁺-type polysilicon film (not shown) with a thickness of approximately 150 nm and a doping concentration of approximately $10^{16}$ to $10^{21}$ atoms/cm³ is formed over the whole substrate 301 by LPCVD. The n⁺-type polysilicon film is patterned by photolithography and anisotropic etching, forming the gate electrode 314a and 314b.

The gate electrode 314a covers the part (for the channel region) of the n⁻-type polysilicon film 311a in self alignment. The end of the gate electrode 314a is located at a location just over the connection part of the gate electrode 304aa and the n⁺-type diffusion region 305bb. Similarly, the gate electrode 314b covers the part (for the channel region) of the n⁻-type polysilicon film 311b in self alignment. The end of the gate electrode 314b is located at a location just over the connection part of the gate electrode 304ba and the n⁺-type diffusion region 305ab.

Subsequently, using the gate electrodes 314a and 314b as a mask, boron (B) as a p-type impurity is selectively doped into the n⁻-type patterned polysilicon films 311a and 311b by ion-implantation. Thus, the p⁻-type polysilicon regions 315a and 315b are formed in the n⁻-type patterned polysilicon films 311a and 311b in self alignment with the gate electrodes 314a and 314b. The remaining parts 311aa and 311ba of the patterned polysilicon films 311a and 311b, which are located just below the gate electrodes 314a and 314b, serve as the channel regions.

Figure 18B:
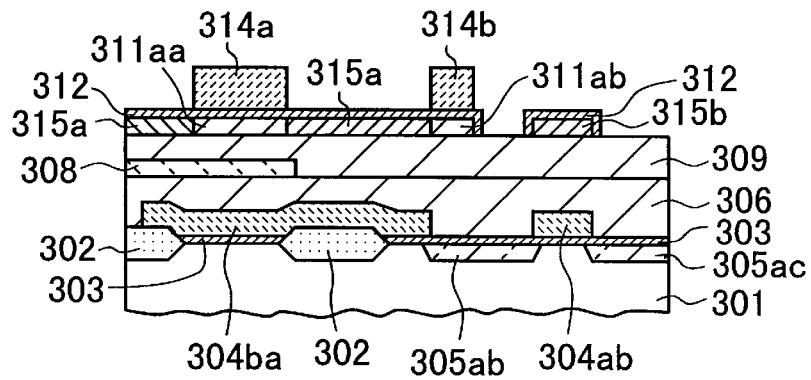

For example, when the patterned polysilicon films 311a and 311b has a doping concentration of $1 \times 10^{17}$ atoms/cm³, the polysilicon channel regions 311aa and 311ba (and 311ab) have the same doping concentration of $1 \times 10^{17}$ atoms/cm⁻. Corresponding to this concentration, the polysilicon regions 315a and 315b have a doping concentration of $1 \times 10^{19}$ atoms/cm³. The state at this stage is shown in FIG. 18B.

Figure 18C:
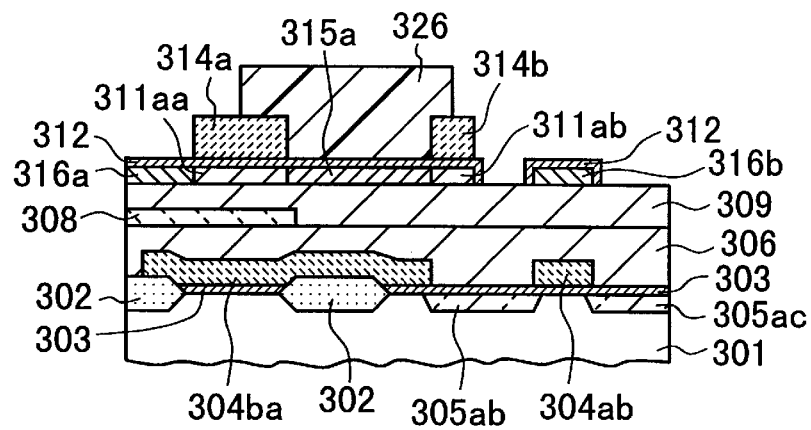
Figure 18D:
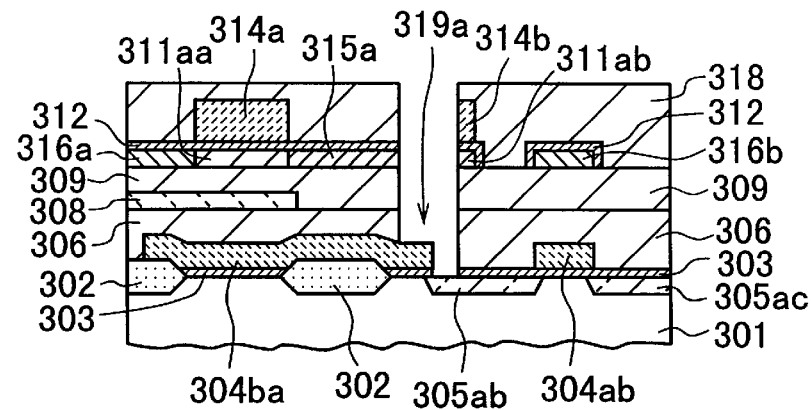

Further, using a patterned photoresist film 326 and the gate electrodes 314a and 314b as a mask, boron (B) or boron fluoride (BF²) as a p-type dopant is selectively doped into the p⁻-type polysilicon regions 315a and 315b located on the left-hand side of the n⁻-type patterned polysilicon films 311a and 311b by ion-implantation, resulting in the p⁺-type polysilicon regions 316a and 316b serving as the source regions. The doping concentration of the p⁺-type polysilicon regions 316a and 316b is in the order of $10^{19}$ atoms/cm³, which corresponds to the doping concentration of $1 \times 10^{17}$ atoms/cm³ of the patterned polysilicon films 311a and 311b. The p⁺-type polysilicon regions 316a and 316b serve as the source regions of the first and second p-channel TFTs. The state at this stage is shown in FIG. 18C.

After the photoresist film 326 is removed, a silicon dioxide film (not shown) with a thickness of approximately 100 nm is formed to cover the gate electrodes 314a and 314b by LPCVD over the whole substrate 301. A BPSG film (not shown) with a thickness of approximately 600 nm is formed on the silicon dioxide film by LPCVD over the whole substrate 301. The BPSG film is subjected to a heat treatment at a temperature of 800 to 850° C. to be reflown. The BPSG film is further subjected to CMP to thereby planarize the surface of the BPSG film. Thus, the interlayer insulating film 318 is formed.

The interlayer insulating film 318, the gate electrodes 314a and 314b, the gate oxide film 312, the n⁻-type polysilicon film 311ba, the interlayer insulating films 309 and 306, and the gate oxide film 303 are selectively etched by photolithography and isotropic etching, thereby forming the contact holes 319a and 319b (the first and second node contact holes). The contact hole 319a extends to the gate electrode 304aa and the n⁺-type diffusion region 305bb. The contact hole 319b extends to the gate electrode 304ba and the n⁺-type diffusion region 305ab.

Subsequently, an n⁺-type polysilicon film (not shown) with a doping concentration in the order of $10^{19}$ to $10^{21}$ atoms/cm³ is formed on the interlayer insulating film 318 over the whole substrate 301. This n⁺-type polysilicon film is then etched back to form the contact plugs 320a and 320b filling the contact holes 319a and 319b, respectively.

An interlayer insulating film 322 with a thickness of approximately 20 nm is then formed on the interlayer insulating film 318 to cover the tops of the contact plugs 320a and 320b. This interlayer insulating film 322 is formed by forming a silicon dioxide film or BPSG film and applying heat treatment and surface planarization processes to the silicon dioxide film or BPSG film.

Through these heat treatment processes for the interlayer insulating film 322, the n-type dopant existing in the contact plugs 320a and 320b are thermally diffused into the first and second n⁻-type polysilicon films 311a and 311b. Thus, the n⁺-type polysilicon regions 321a and 321b (which serve as the second drain region) and the p⁻-type-polysilicon regions 315aa and 315ba (which serve as the first drain region and the offset region).

Figure 18E:
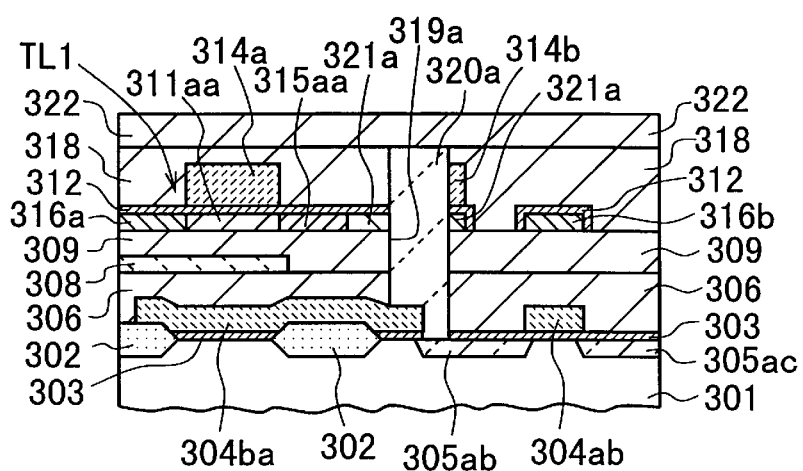

The formation of the first and second TFTs is completed at this stage, as shown in FIG. 18E.

Further, the interlayer insulating films 322, 318, 309, and 306, and the gate oxide films 303 are successively etched by photolithography and etching, thereby forming the contact holes 323a and 323b (first and second bit contact holes) for electrical connection to the bit lines BL1 and BL2. The contact hole 323a vertically extends to the n⁺-type diffusion regions 305ac. The contact hole 323b vertically extends to the n⁺-type diffusion regions 305bc.

A titanium film (not shown) with a thickness of approximately 50 nm and a titanium nitride film (not shown) with a thickness of approximately 100 nm are successively formed on the interlayer insulating film 322 over the whole substrate 301 by sputtering or reactive sputtering. A tungsten film (not shown) is formed on the titanium nitride film by LPCVD. Then, the tungsten film is etched back to form the contact plugs 324a and 324b by these stacked conductive films of titanium, titanium nitride, and tungsten. Thus, the contact holes 223a and 223b are filled with the contact plugs 324a and 324b, respectively.

Further, an aluminum film (not shown) is formed on the interlayer insulating film 322 over the whole substrate 301. The aluminum film and the underlying titanium nitride and the titanium films are successively patterned by anisotropic etching. Thus, the bit lines 325a and 325b are formed.

Through the above-described process steps, the memory cell of an SRAM according to the fourth embodiment is completed as shown in FIGS. 14, 15, 16, and 17.

If the contact plugs 324a and 324b are not made of a non-silicon conductive material, prior to the formation of the interlayer insulating film 318 (i.e., immediately after the formation of the gate oxide films 312 or after the formation of the gate electrodes 314a and 314b), the n$^+$-type polysilicon films 321a and 321b may be formed by using the photolithography and ion implantation techniques.

In this case, there is an advantage that no limit is applied to the material selection for the gate electrodes 314a and 314b. However, the offset length fluctuation is dependent upon this photolithography process.

In the memory cell according to the fourth embodiment, the first and second load MOS transistors TL1 and TL2 are formed by the p-channel TFTs of the top-gate type. However, p-channel TFTs of the bottom-gate type may be used. In this case, the positions of the first and second n$^-$-type patterned polysilicon films 311a and 311b and the gate electrodes of the first and second TFTs are turned upside down.

The memory cell of an SRAM including the top-gate type TFTs according to the fourth embodiment of the present invention has the same advantages as those in the third embodiment.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A thin-film transistor comprising:

a substrate;

a patterned semiconductor film formed on a main surface of said substrate;

at least the main surface of said substrate having an insulating property;

said patterned semiconductor film being made of a silicon-system semiconductor material and being not monocrystalline;

said patterned semiconductor film including a source region of a first conductivity type, a channel region of a second conductivity type opposite to said first conductivity type, a first drain region of said first conductivity type, and a second drain region of said second conductivity type;

said first drain region serving as an offset region;

a gate electrode formed to be opposite to said channel region through a gate insulating film;

said source region being formed on one end of said semiconductor film;

said second drain region being formed on an opposite end of said semiconductor film to said source region;

said channel region being formed to be adjacent to said source region and said first drain region;

said first drain region being formed to be adjacent to said channel region and said second drain region;

a first voltage being applied across said source region and said second drain region;

a second voltage being applied to said gate electrode.

2. A transistor as claimed in claim 1, wherein said channel region has a doping concentration less than that of said first drain region.

3. A transistor as claimed in claim 1, wherein said gate electrode is located on an opposite side to said substrate with respect to said gate insulating film.

4. A transistor as claimed in claim 1, wherein said gate electrode is located on a same side as said substrate with respect to said gate insulating film.

* * * * *

UNITED STATES PATENT AND TRADEMARK OFFICE
CERTIFICATE OF CORRECTION

PATENT NO. : 5,965,905
DATED : October 12, 1999
INVENTOR(S) : Fumihiko HAYASHI

It is certified that error appears in the above-indentified patent and that said Letters Patent is hereby corrected as shown below:

Column 16, line 3, delete "For example)" and insert --For example,--.

Column 22, line 49, delete "atoms/cm⁻" and insert --atoms/cm$^3$--.

Column 27, line 49, delete "atoms/cm⁻" and insert --atoms/cm$^3$--.

Signed and Sealed this

Third Day of April, 2001

Attest:

NICHOLAS P. GODICI

Attesting Officer

Acting Director of the United States Patent and Trademark Office